(12) United States Patent
Weathers et al.

(10) Patent No.: US 9,881,670 B2
(45) Date of Patent: Jan. 30, 2018

(54) SOFT INFORMATION MODULE

(71) Applicant: HGST Technologies Santa Ana, Inc., Santa Ana, CA (US)

(72) Inventors: Anthony Dwayne Weathers, San Diego, CA (US); Richard David Barndt, San Diego, CA (US); Xinde Hu, San Jose, CA (US)

(73) Assignee: HGST Technologies Santa Ana, Inc., Santa Ana, CA (US)

( * ) Notice: Subject to any disclaimer, the term of this patent is extended or adjusted under 35 U.S.C. 154(b) by 0 days.

(21) Appl. No.: 14/853,941

(22) Filed: Sep. 14, 2015

(65) Prior Publication Data

US 2016/0005460 A1    Jan. 7, 2016

Related U.S. Application Data

(63) Continuation of application No. 13/843,225, filed on Mar. 15, 2013, now Pat. No. 9,136,011.
(Continued)

(51) Int. Cl.
*G06F 11/00* (2006.01)
*G06F 11/08* (2006.01)
(Continued)

(52) U.S. Cl.
CPC ...... *G11C 11/5642* (2013.01); *G06F 11/1048* (2013.01); *G11C 11/5628* (2013.01); *G11C 16/08* (2013.01); *G11C 16/3454* (2013.01); *H03M 13/1105* (2013.01); *H03M 13/1111* (2013.01); *G06F 11/008* (2013.01); *G06F 11/08* (2013.01); *G11C 16/3422* (2013.01); *G11C 2211/5641* (2013.01)

(58) Field of Classification Search
CPC . G11C 11/5642; G11C 11/5628; G11C 16/08; G11C 16/3454; G11C 16/3422; G11C 2211/5641; G06F 11/1048; G06F 11/008; G06F 11/08; H03M 13/1111; H03M 13/1105
USPC ............................................. 714/763
See application file for complete search history.

(56) References Cited

U.S. PATENT DOCUMENTS 8,291,279 B2  10/2012 Sharon et al.
8,370,711 B2   2/2013 Alrod et al.
(Continued)

*Primary Examiner* — James C Kerveros
(74) *Attorney, Agent, or Firm* — McDermott Will & Emery LLP

(57) ABSTRACT

A soft information module is coupled between one or more flash memory devices and a decoder. The soft information module receives a putative value of one or more memory cells of the one or more flash memory devices based on a read of the one or more memory cells at an initial read level, and one or more respective indicators of whether the putative value was read at one or more respective different read levels offset from the initial read level, and receives a page indicator for the read. The soft information module determines a cell program region for the read based on the putative value, the one or more respective indicators, and the page indicator, identifies a predetermined confidence value for the region, and provides the confidence value to the decoder for association with the putative value, the confidence value being representative of a likelihood that the one or more memory cells was programmed to the putative value.

20 Claims, 19 Drawing Sheets

Related U.S. Application Data

(60) Provisional application No. 61/639,040, filed on Apr. 26, 2012.

(51) Int. Cl.
  *G06F 11/10* (2006.01)
  *G11C 29/56* (2006.01)
  *G11C 16/08* (2006.01)
  *G11C 16/34* (2006.01)
  *H03M 13/11* (2006.01)
  *G11C 11/56* (2006.01)

(56) References Cited

U.S. PATENT DOCUMENTS

| | | |
|---|---|---|
| 8,392,809 B1 | 3/2013 | Varnica et al. |
| 8,429,501 B2 | 4/2013 | Tseng et al. |
| 8,453,034 B2 | 5/2013 | Sakaue et al. |
| 8,504,895 B2 | 8/2013 | Sharon et al. |
| 8,549,380 B2 * | 10/2013 | Motwani ............ G06F 11/1048 365/185.02 |
| 8,782,496 B2 * | 7/2014 | Sakaue ................ G06F 11/1048 714/773 |
| 8,788,923 B2 | 7/2014 | Haratsch et al. |
| 2011/0145487 A1 * | 6/2011 | Haratsch ................ G11C 7/02 711/103 |
| 2011/0235415 A1 * | 9/2011 | Park .................... G11C 11/5642 365/185.09 |
| 2012/0005560 A1 * | 1/2012 | Steiner .................. H03M 13/09 714/780 |
| 2013/0173985 A1 * | 7/2013 | Chung ............... H03M 13/1111 714/755 |
| 2014/0122973 A1 * | 5/2014 | Motwani ............ H03M 13/1105 714/773 |

* cited by examiner

| Page | lsb_Data | Table |
|------|----------|-------|
| 0 | x | A |
| 1 | 0 | B |
| 1 | 1 | A |
FIG. 14B
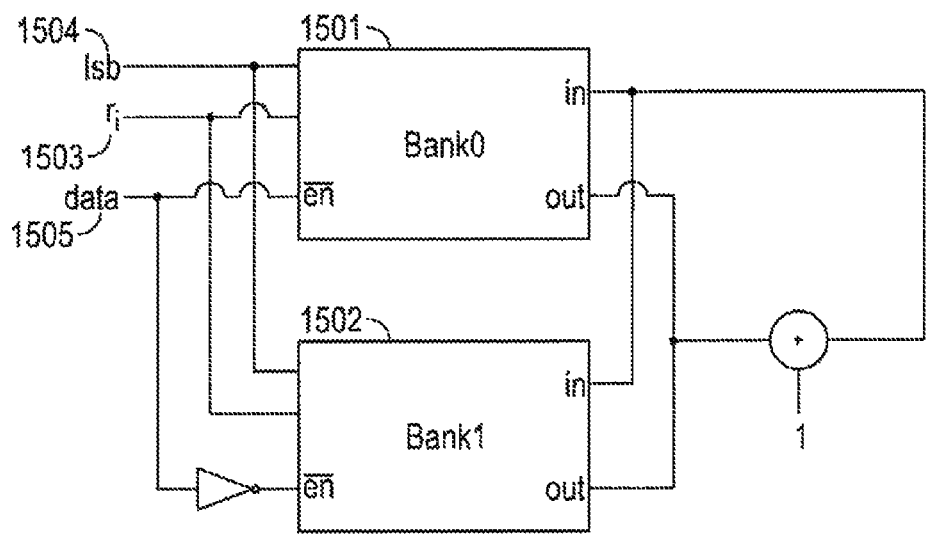
FIG. 15
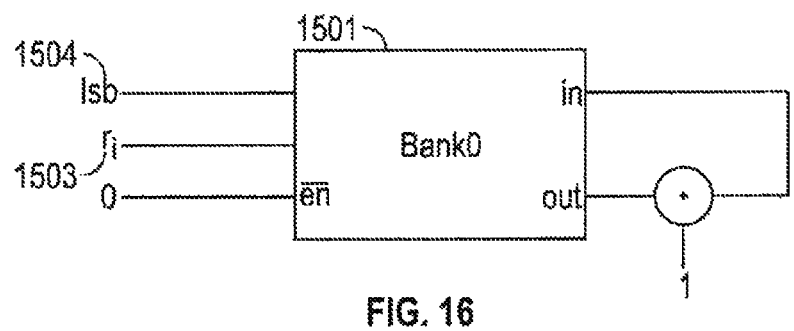
FIG. 16

| page | msb | lsb | Table |
|---|---|---|---|
| 0 | x | x | A |
| 1 | x | 0 | B |
| 1 | x | 1 | A |
| 2 | 0 | 0 | A |
| 2 | 1 | 0 | B |
| 2 | 0 | 1 | B |
| 2 | 1 | 1 | A |

SOFT INFORMATION MODULE

The present application claims the benefit of priority under 35 U.S.C. §120 as a continuation of U.S. patent application Ser. No. 13/843,225 entitled "Soft Information Module," filed on Mar. 15, 2013, which claims the benefit of priority under 35 U.S.C. §119 as a nonprovisional of U.S. Provisional Patent Application No. 61/639,040, entitled "Soft Information Module," filed on Apr. 26, 2012, the disclosures of which are hereby incorporated by reference in their entirety for all purposes.

BACKGROUND

Flash memory devices store information by placing charge on a floating gate. For example, single-level cell (SLC) flash devices store binary information in a cell by either programming a level of charge in a cell or leaving it erased. In multi-level cell (MLC) flash devices, multiple bits are stored in a cell by placing one of several possible levels of charge on the cell or leaving it erased. During a read operation, a series of voltage comparisons allows an estimate of charge levels for a particular cell. Each level is associated with a binary pattern. By estimating the charge level, an estimate of the bit pattern for each charge level may be made. In some instances, the threshold voltage for certain cells may be very close to the read levels that were used in the comparison of different levels. In such instances, the estimate for such a case is unreliable. Thus, in order to improve the error rate, it is useful to have not just the bit estimates, but also an indication of the reliability of each estimate. This reliability measure may be called "soft information."

SUMMARY

The subject disclosure relates to the retrieval of soft information from a flash memory device, such as solid-state drive. Particularly, the subject disclosure pertains to a soft information module for extracting soft information from a flash memory device for use in improving an error rate of the flash memory device.

A method for generating reliability information from a flash memory device is disclosed. In one aspect, the method may include reading a plurality of memory cells at a first read level to obtain a plurality of program values, receiving an error indicator in connection with the reading of the plurality of memory cells, reading, in response to receiving the error indicator, the plurality of memory cells at one or more different read levels to categorize the plurality of memory cells into two or more cell program regions, and assigning a confidence value to each memory cell based on a corresponding cell program region for the memory cell, the confidence value representative of a likelihood that the memory cell is programmed to a corresponding program value read at the first read level. In another aspect, a machine-readable medium may include instructions stored thereon that, when executed by a processor, perform the previously described method.

In another aspect, a system may include one or more flash memory devices and a controller operable to initiate one or more memory commands to the one or more flash memory devices. In this regard, the controller may be further operable to determine a putative program level for one or more memory cells of the one or more flash memory devices, initiate multiple reads of the one or more memory cells at different levels, and determine a probability that the one or more memory cells are programmed to the putative program level based on the multiple reads.

In a further aspect, a machine-readable medium includes instructions stored thereon that, when executed by a processor, perform a method for generating reliability information from a flash memory device. In this regard, the method may include determining a putative program level for one or more memory cells of the one or more flash memory devices, initiating multiple reads of the one or more memory cells at different levels, categorize the one or more memory cells into two or more cell groups based on the multiple reads, and determining a probability that the one or more memory cells are programmed to the putative program level based on the putative program level and a cell group in which the one or more memory cells are categorized.

BRIEF DESCRIPTION OF THE DRAWINGS

FIG. 14B depicts an example table selection map for the region discriminator.

FIG. 15 depicts a first example hardware schematic for determining how many memory cells are in each cell program region.

FIG. 16 depicts a second example hardware schematic for determining how many memory cells are in each cell program region.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent that the subject technology may be practiced without these specific details. In some instances, structures and components are shown in block diagram form in order to avoid obscuring the concepts of the subject technology. Like components are labeled with identical element numbers for ease of understanding.

The subject technology provides a soft information module for generating reliability information ("soft information") from a flash memory device. Extracting soft information opens up the possibility of using advanced detection techniques for improving the error rate. Although the subject technology may be utilized to improve error correction using a variety of error correction schemes, the subject technology may be used for LDPC or turbo coded systems. Thus, in certain aspects, use of the soft information module will enable performance improvements without requiring any design changes to the flash memory.

Figure 1:
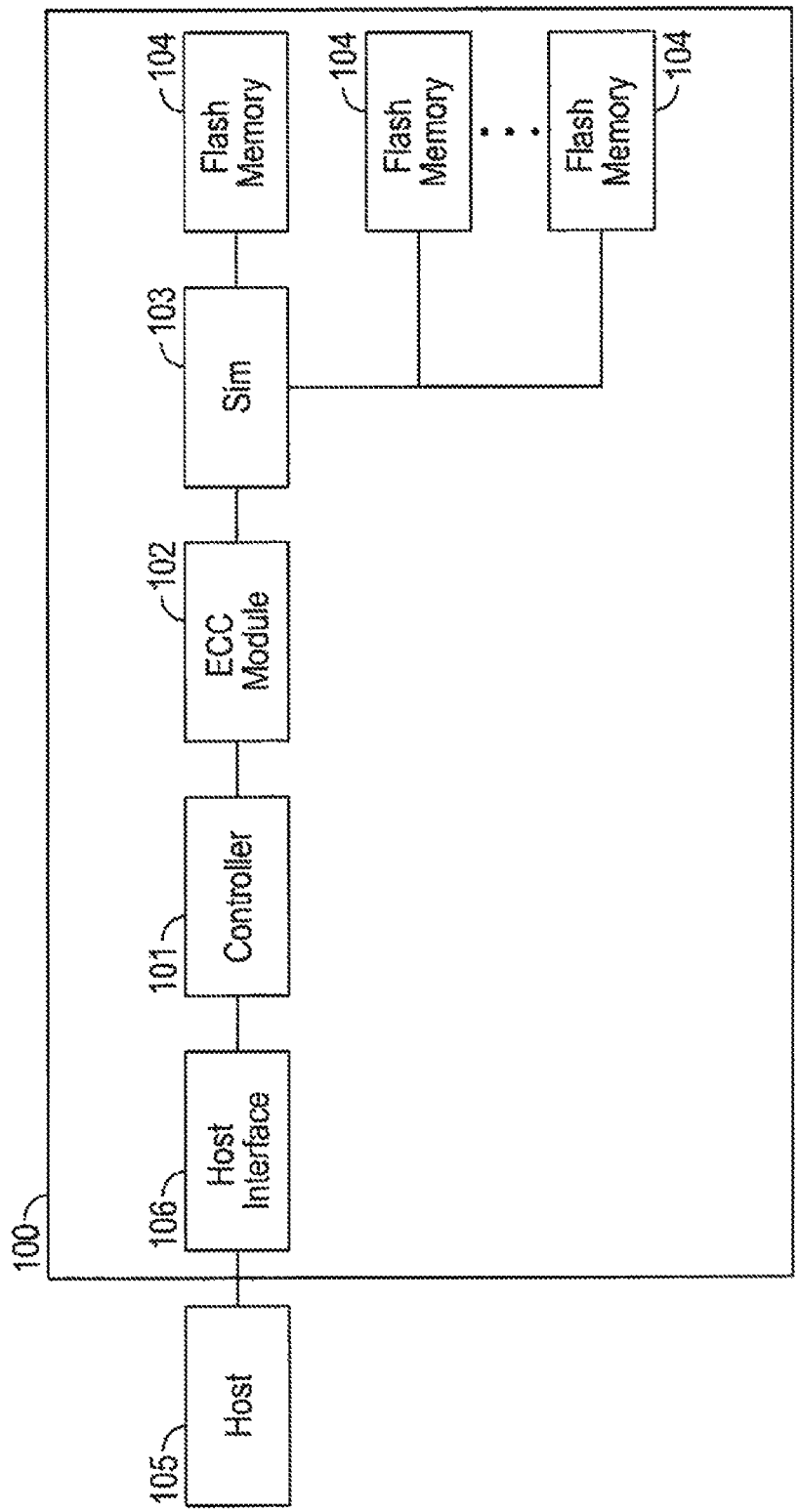
FIG. 1 is a block diagram depicting example components of a flash storage device.

FIG. 1 is a block diagram depicting example components of a flash storage device 100 according to aspects of the subject technology. Flash storage device 100 includes a data storage controller 101, a ECC module 102, a soft information module (SIM) 103 and an array of flash memory devices 104. The elements of the flash memory device may be integrated into a single chip or implemented in two or more discrete components. As depicted in FIG. 1, a host 105 is coupled to the flash memory device via a host interface 106.

Data storage controller 101 may be implemented with a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on a ROM within the controller. One or more sequences of instructions also may be software stored and read from another storage medium, such as the flash memory array, or received from a host device (e.g., the host) via a host interface. ROM, storage mediums, and flash memory arrays represent examples of machine or computer readable media on which instructions/code executable by the controller. Machine or computer readable media may generally refer to any medium or media used to provide instructions to the controller, including both volatile media, such as dynamic memory used for storage media or for buffers within the controller, and non-volatile media, such as electronic media, optical media, and magnetic media.

Host interface 106 may be configured to implement a standard interface, such as Serial-Attached SCSI (SAS), Fiber Channel interface, PCI Express (PCIe), SATA, USB, and the like. The host interface may be configured to implement only one interface. Alternatively, the host interface may be configured to implement multiple interfaces, which are individually selectable using a configuration parameter selected by a user or programmed at the time of assembly. Host interface 106 may include one or more buffers for buffering transmissions between a host device and the controller. A host device (e.g., host 105) may be any device configured to be coupled to the data storage system and to store data in data storage system. In some examples, the host device may be a computing system such as a personal computer, a server, a workstation, a laptop computer, PDA, smart phone, and the like. Alternatively, the host device may be an electronic device such as a digital camera, a digital audio player, a digital video recorder or the like.

The flash memory array represents non-volatile memory devices 104 for storing data. By way of example, the flash memory array may comprise a single-level cell (SLC) memory, a multi-level cell (MLC) memory, a three-level cell (TLC) memory device, etc. In some aspects, the flash memory array 140 may comprise one or more hybrid memory devices that may function in one or more of a SLC, MLC or TLC mode.

Each component of the flash memory array may include a single flash memory device or chip, or may include multiple flash memory devices or chips arranged in multiple channels, as depicted in FIG. 1. However, the flash memory is not limited to any particular capacity or configuration. For example, the number of cell states, the number of physical blocks, the number of physical pages per physical block, the number of sectors per physical page, and the size of the sectors may vary within the scope of the subject technology.

ECC module 102 represents one or more components configured to generate code words to be stored in the flash memory array from data received from the host and to decode code words read from the flash memory array before sending the decoded data to the host. In some implementations, ECC module 102 may comprise one or more memory devices and/or one or more processing units used to perform error correction (e.g., using LDPC or turbo codes).

Data storage controller 101 is operable to, by communicating with a flash channel, determine putative program levels (e.g., determined by a first read operation) for a plurality of memory cells in a flash memory device and determine, via soft information module 103, a probability that the memory cells are indeed programmed to their putative program levels. For example, a putative program level $s_i$ may be determined by reading a memory cell at a first read level voltage. Data storage controller 101 may then determine a probability that the memory cell is programmed to its putative program level based on a series of subsequent reads of the memory cell at different levels.

Figure 2:
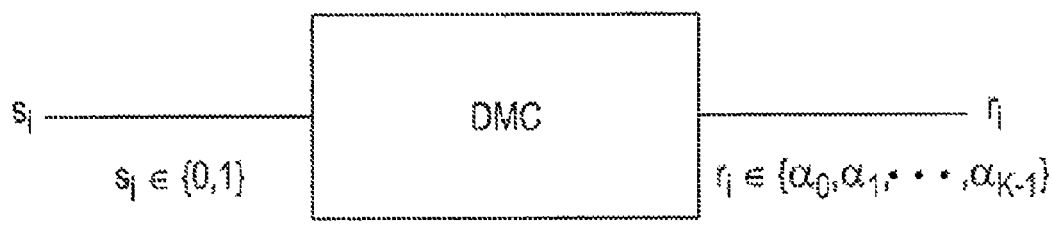
FIG. 2 depicts an example flash memory channel modeled as a discrete memory-less channel with binary inputs and K-ary outputs.

FIG. 2 depicts an example flash memory channel modeled as a discrete memory-less channel with binary inputs and K-ary outputs, according to aspects of the subject technology. In this example, the K-ary outputs correspond to K cell program regions that may be identified with multiple reads. The above model provides a definition for a log-likelihood ratio (LLR). Using this model, the LLR may be defined as:

$$LLR_i = \log\frac{p(s_i = 0 \mid r_i)}{p(s_i = 1 \mid r_i)} = \log\frac{p(r_i \mid s_i = 0)p(s_i = 0)/p(r_i)}{p(r_i \mid s_i = 1)p(s_i = 1)/p(r_i)} \quad (1)$$

In some implementations it may be assumed that all inputs are equally probable; as such the expression of Equation (1) becomes:

$$LLR_i = \log\frac{p(r_i \mid s_i = 0)}{p(r_i \mid s_i = 1)} \quad (2)$$

By way of example, if K=2 for a LSB page read, the K regions are designated as $r_i \in \{\alpha_0, \alpha_1\}$ wherein the LLR for region $\alpha_1$ is given by:

$$LLR(\alpha_1) = \log\frac{p(r_i = \alpha_1 \mid s_i = 0)}{p(r_i = \alpha_1 \mid s_i = 1)} \quad (3)$$

Figure 3:
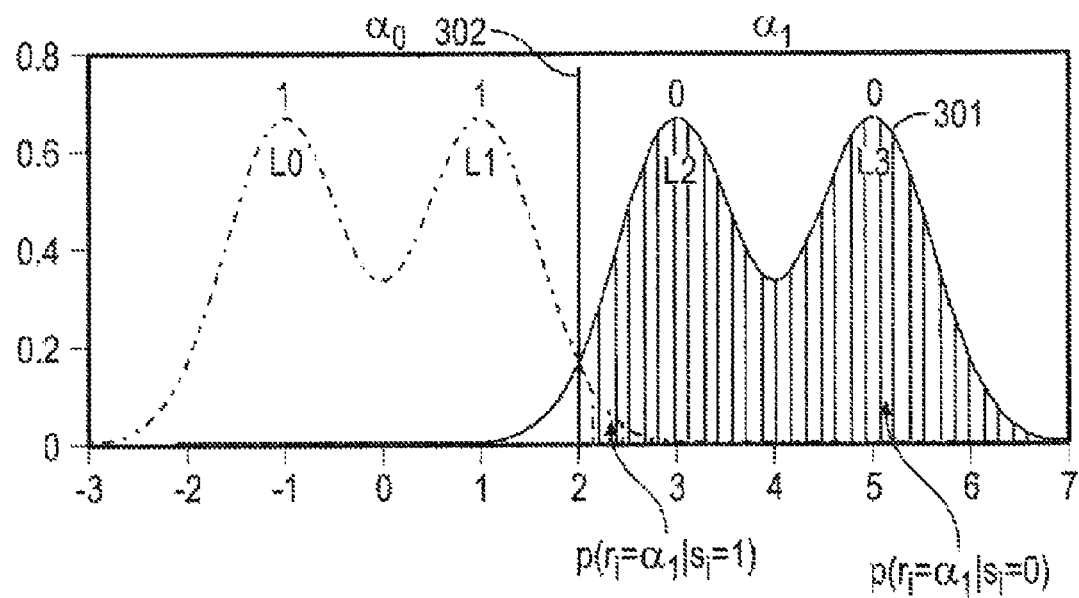
FIG. 3 depicts example conditional probability density functions for a LSB page of MLC flash memory.

FIG. 3 depicts example conditional probability density functions for a LSB page of MLC flash memory, according to aspects of the subject technology. One function of the subject technology determines a distribution curve 301 based on a number of cells programmed to a certain value below or beyond a voltage threshold 302. An LLR for region $\alpha_1$ may be calculated by determining the areas of the curves illustrated therein. By way of further example, in the case that K=6 for an MSB page read, the regions may be designated as:

$$r_i \in \{\alpha_0, \alpha_1, \alpha_2, \alpha_3, \alpha_4, \alpha_5\} \quad (4)$$

Wherein the LLR for region $\alpha_1$ is given by:

$$LLR(\alpha_1) = \log\frac{p(r_i = \alpha_1 \mid s_i = 0)}{p(r_i = \alpha_1 \mid s_i = 1)} \quad (5)$$

Figure 4:
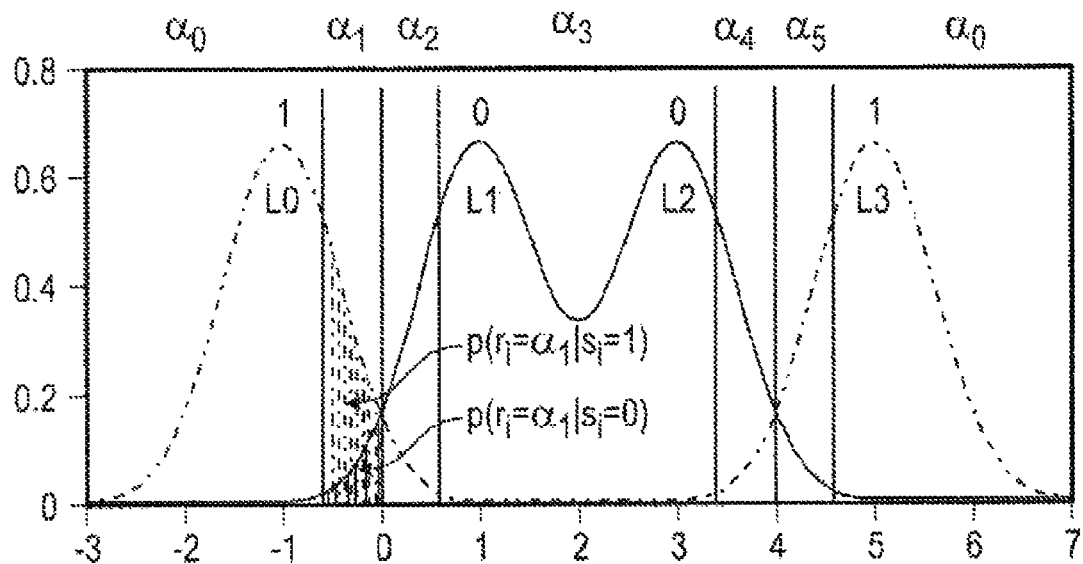
FIG. 4 depicts example conditional probability density functions for a MSB page of MLC flash memory with no LSB read.

FIG. 4 depicts example conditional probability density functions for a MSB page of MLC flash memory with no LSB read, according to aspects of the subject technology. In some implementations (e.g., for an MSB page read operation), more regions may be distinguished if a read operation is also performed on the corresponding LSB page to determine whether to consider the L0/L1 boundary or the L2/L3 boundary. According to aspects of the subject technology, the LLR of Equation (5) may then be calculated for cell program regions that are adjacent to these boundaries, for example, by determining the areas of the shaded regions depicted in FIG. 3.

Figure 5:
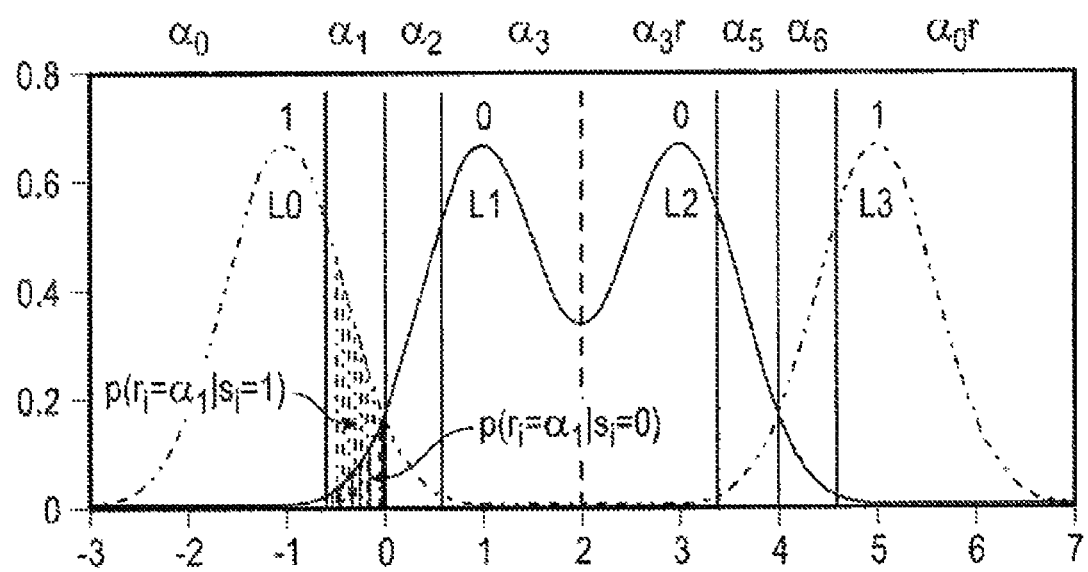
FIG. 5 depicts example conditional probability density functions for a MSB page of MLC flash memory.

FIG. 5 depicts example conditional probability density functions for a MSB page of MLC flash memory, including a LSB read, according to aspects of the subject technology. In this example, the LSB read is performed first to first determine whether the further reads will consider the L0/L1 boundary or the L2/L3 boundary. In some cases, no data is available with which to calibrate the probability distributions. In such cases, the conditional probability density functions cannot be determined, and the LLR may be estimated using an unconditional distribution.

Figure 6:
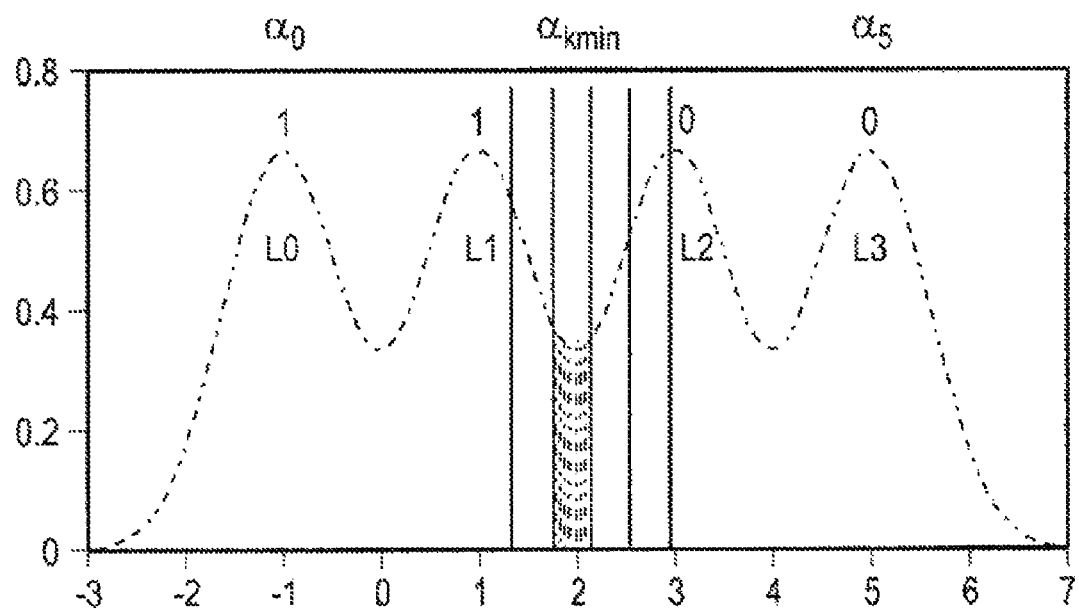
FIG. 6 depicts an example of a LSB page with unknown data.

FIG. 6 depicts an example of a LSB page with unknown data, according to aspects of the subject technology. To proceed with determining an estimate using an unconditional distribution, the region in the vicinity of the transition (e.g., at the read level used to conduct the cell) having the smallest probability of occurrence ($P_{min}$), is determined. The shaded region of FIG. 5 illustrates an example of the region of interest ($K_{min}$).

In one example, a LLR estimate is given by the expression:

$$LLR' = \log\frac{p(r_i)}{p_{min}/2}\gamma(r_i) \quad (6)$$

$$\gamma(\alpha_k) = \begin{cases} -1, & k < k_{min} \\ +1, & \text{else} \end{cases}$$

Depending on implementation, LLR values may be organized into a 4×(N+1) table where N is the number of reads. For example, LLR values may be organized by region as illustrated in Table 1:

TABLE 1

| Region | LLR Values | | | |
|---|---|---|---|---|
| $RL_1$ | $\alpha_0$ | $\alpha_1$ | $\alpha_2$ | $\alpha_3$ |
| $RL_2$ | $\beta_0$ | $\beta_1$ | $\beta_2$ | $\beta_3$ |
| $RL_3$ | $\gamma_0$ | $\gamma_1$ | $\gamma_2$ | $\gamma_3$ |
| $RL_{LOW}$ | $\delta_0$ | $\delta_1$ | $\delta_2$ | $\delta_3$ |

Wherein each row corresponds to one of read levels, $RL_1$, $RL_2$, $RL_3$ and $RL_{LOW}$.

Figure 7A:
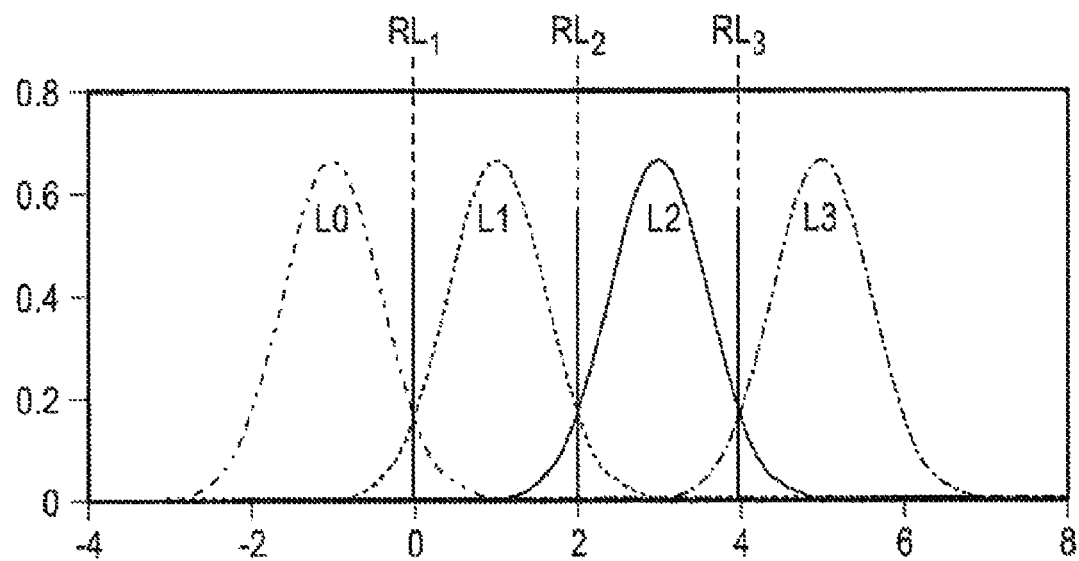
FIG. 7A depicts an example graph diagram of four possible cell program distributions and complimentary cell read levels in a multi-level cell flash memory.

FIG. 7A depicts an example graph diagram of four possible cell program distributions and complimentary cell read levels in a multi-level cell flash memory, according to aspects of the subject technology. As depicted, a MLC NAND cell is capable of storing four states (amounts of charge) per cell, yielding two logical bits of information per cell: the Most Significant Bit (MSB) and the Least Significant Bit (LSB). These two bits may make up corresponding MSB and LSB pages of a memory block. Accordingly, a memory cell in a page, sector, or other unit of memory may be programmed to any one of these states, making up one or more distributions L0, L1, L2, L3 for the unit of memory.

In some implementations, to ensure that all cells in a distribution will conduct, a read level voltage greater than the distribution is applied. In this regard, $RL_1$ voltage will cause cells in the L0 distribution to conduct, $RL_2$ voltage will cause cells in the L1 distribution to conduct, $RL_3$ voltage will cause cells in the L2 distribution to conduct, and so on. Where, as depicted by FIG. 6, only four states are available, $RL_3$ voltage will not cause any cells in L3 distribution to conduct, thereby generating a binary x0 in the LSB for those cells. Generally, for N distributions there will be N-1 read levels. In the depicted example, there are four distributions (states) and three read levels. However, it is understood that there may be eight, sixteen, or more distributions without departing from the scope of the subject technology.

Figure 7B:
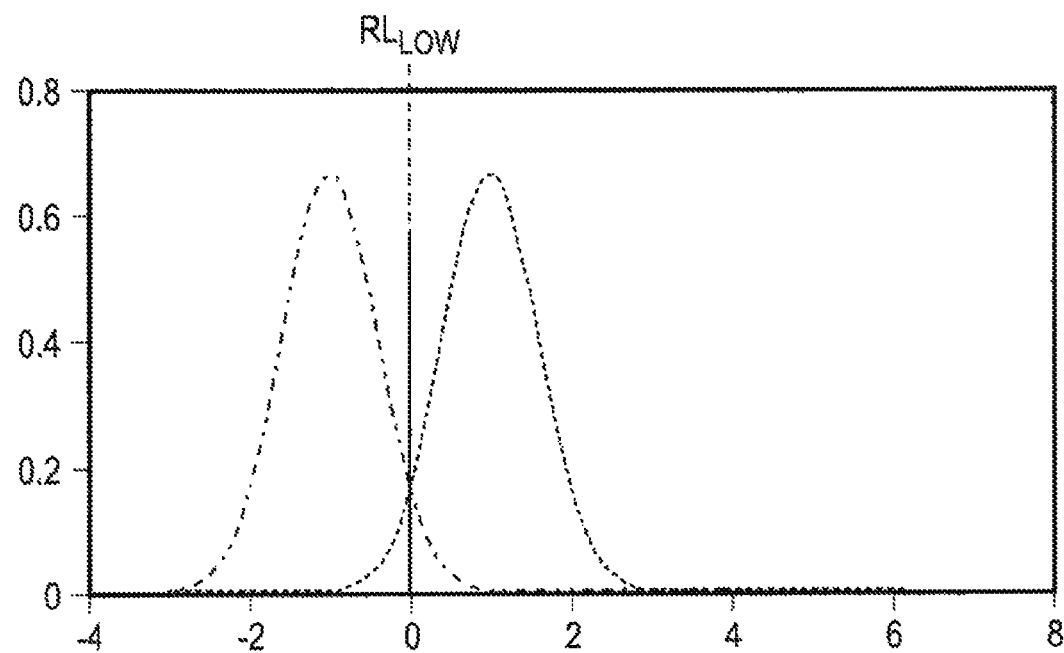
FIG. 7B depicts an example graph diagram of two possible cell program distributions and a complimentary read level.

FIG. 7B depicts an example graph diagram of two possible cell program distributions and a complimentary read level, according to aspects of the subject technology. In this example, the read level $RL_{LOW}$ represents a voltage used to read a LSB bit of a MLC memory cell. In some aspects, an initial read is performed at $RL_{LOW}$ to determine at what level to set subsequent reads for determining the value, or probability of the value, of an MSB bit.

Figure 8:
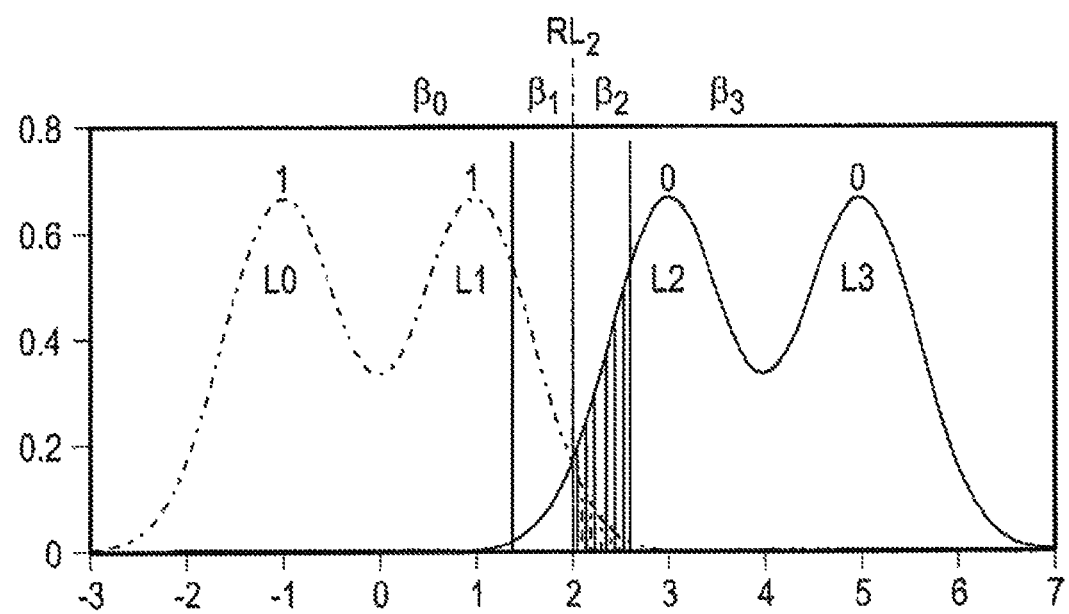
FIG. 8 depicts an example probability determination for a LSB page using three read levels.

FIG. 8 depicts an example probability determination for a LSB page using three read levels, according to one aspect of the subject technology. A first read level is used in a first read of a LSB page to determine putative program levels for the memory cells of the LSB page. To determine a probability that the memory cells were actually programmed to the observed putative program levels, multiple reads are initiated.

In the depicted example, the memory cells are read using a second read level below the first read level and a third read level above the first read level. A first program region includes one or more cells having a programmed value between the first read level and the second read level, and a second program region comprises one or more cells having a programmed value between the first read level and the third read level. In various aspects, a confidence value may be calculated for each cell program region based on how many of the memory cells are in the cell program region compared to one or more other program regions. As described previously, a confidence value may be determined for a cell program region based on the area under the distribution curve for the cell program region. The confidence value is then assigned to each memory cell in the corresponding cell program region.

Figure 9:
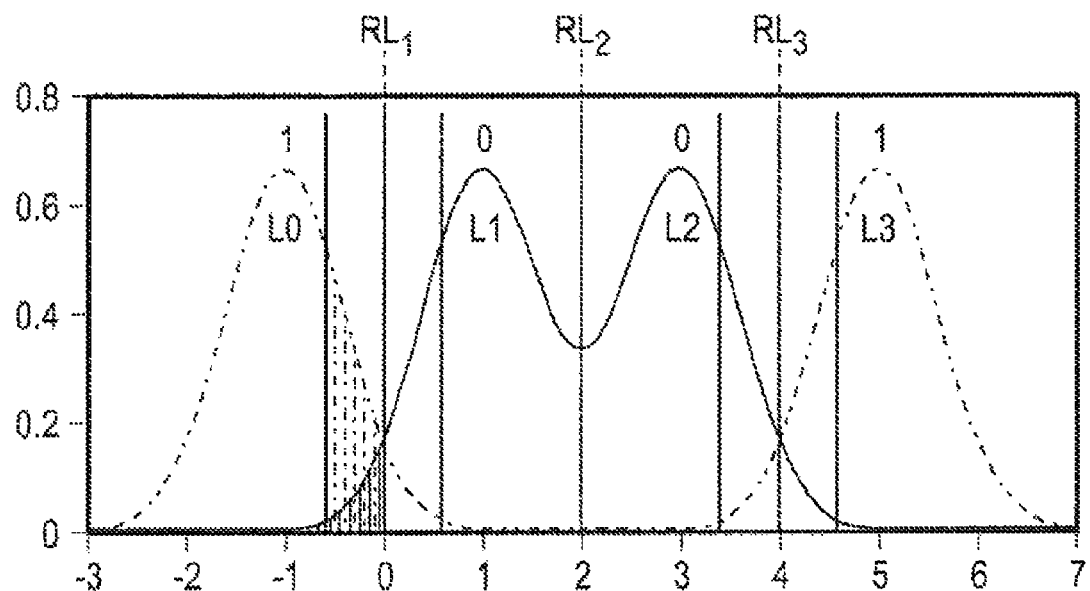
FIG. 9 depicts an example probability determination for a MSB page using three read levels.

FIG. 9 depicts an example probability determination for a MSB page using three read levels. According to aspects of the subject technology, an initial read level may be applied to one or more memory cells to obtain a LSB value for each memory cell. Based on the LSB value, a first read level may be determined for reading a putative program level for the MSB. Once the first read level is determined and program level read, multiple subsequent reads may be initiated as described by FIG. 7 to determine a probability that the memory cell was actually programmed to the observed putative program level.

Figure 10:
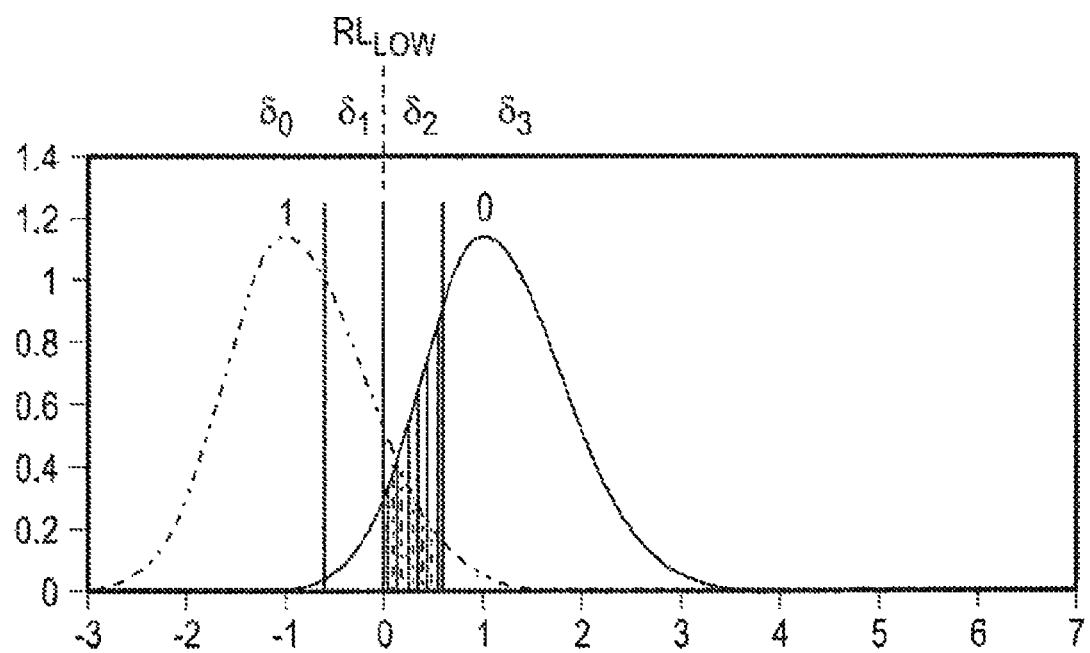
FIG. 10 depicts an example probability determination for a LSB page where the MSB has not been programmed.

FIG. 10 depicts an example probability determination for a LSB page where the MSB has not been programmed. In some aspects, each memory cell may be associated with a flag (hardware or programmed bit) that determines whether the cell has been programmed with the MSB. Where the MSB has not been programmed, the LSB bit may be determined as described with regard to FIG. 8. In this regard, the first read level may be set to $RL_{LOW}$.

Figure 11:
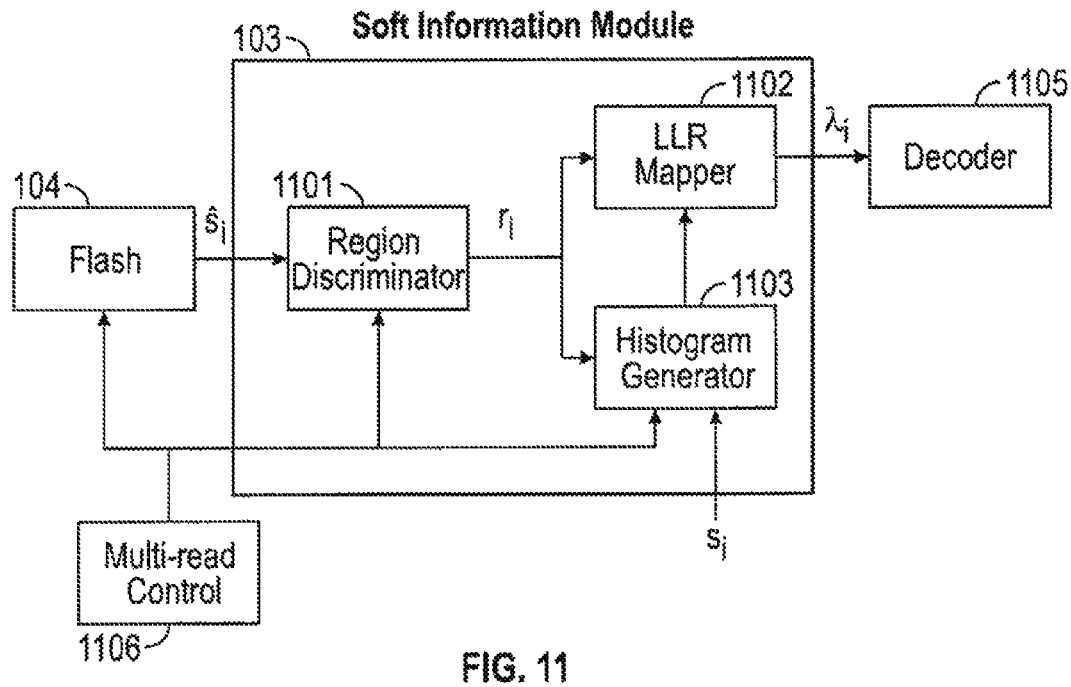
FIG. 11 depicts a block diagram of an example soft information module.

FIG. 11 depicts a block diagram of an example soft information module 103, according to aspects of the subject technology. In the depicted example, soft information module (SIM) 103 comprises a region discriminator 1101, e.g., a LLR "mapper" 1102 and a histogram generator 1103.

In practice, SIM 103 may be implemented between a flash memory device 104 (e.g., one or more flash memories in the flash array described in FIG. 1) and a decoder 1105 (e.g., ECC module 102 or one or more components thereof), while also being coupled to a multi-read controller 1106 (e.g., data storage controller 101 or a component thereof). The histogram generator may be used during calibration, wherein the LLR mapper is used for generating soft information to be sent to the decoder.

Multi-read controller 1106 may set the read level before each of N number of reads. A lookup table may be used to determine how many read levels, and the values for the read levels, based on how many cell program regions are to be used in determining LLR values for the memory cells. Multi-read controller 1106 may instruct flash memory device 104 to read the LSB or MSB page using the stored read levels. To create the previously described cell program regions, a first read level is used to determine a putative value of the cells and then multiple reads (e.g., a series of reads) are performed to determine associated LLR values. In some aspects, read levels are determined by varying the first read level by a predetermined (e.g., stored) offset associated with a respective region.

Region discriminator 1101 looks for transitions in the read data to determine which region contains the voltage threshold ($V_T$) of each memory cell. Accordingly, the first read level may be stored (e.g., temporarily), and a region determined based on (e.g., positive or negative) a binary value ŝ read from the memory cell, and differences between the first read level and subsequent read levels initiated by multi-read controller 1106. The read levels may or may not be changed in a predetermined order. If the read levels are changed in a prescribed order, only the previous read level may be stored and the cell program region determined on each subsequent read. If all reads are performed (e.g., at once), a lookup table may be used to determine the cell program regions based on the received binary values ŝ. Once determined, a region (or "bin") number for each cell program region may be transmitted to LLR mapper 1102. LLR mapper 1102 receives the region number for each memory cell and maps the region number to a LLR value in a lookup table.

Histogram generator 1103 receives, from region discriminator 1101, the number of regions, the range of read level values for each region, and the region number assigned to each memory cell. In some implementations, the number of regions and respective ranges may be received from multi-read controller 1106. Histogram generator further receives the putative values $s_i$ from flash memory device 1104 (e.g., via a data bus), or from data storage controller 101 or other component of data storage device 100. Histogram generator 1103 may determine one or more program level distributions based on the putative values for the memory cells, and one or more corresponding distribution curves for the distributions. Histogram generator 1103 then counts how many cells are within each cell program region based on the information received from region discriminator 1101. Histogram generator 1103 may then, based on the counts for each cell program region, determine an estimated area under each distribution curve for a respective cell program region.

As will be described with respect to FIGS. 19-23, the lookup table used by LLR mapper 1102 may be populated with the previously described information from histogram generator 1103 to generate LLR values for each region. In this regard, histogram generator 1103 may be used during calibration to establish LLR values based on test data or simulated data. In some implementations, histogram generator 1103 may be used to establish LLR values based on the putative values and information from the region discriminator 1101, in the previously described manner.

Figure 12:
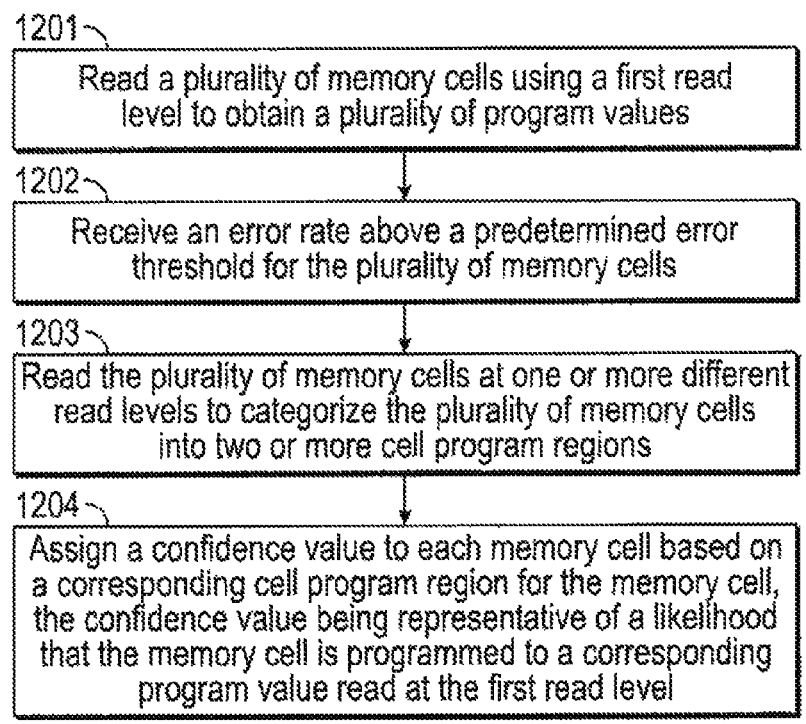
FIG. 12 depicts a flowchart of an example process for generating reliability information from a flash memory device.

FIG. 12 depicts a flowchart of an example process for generating reliability information from a flash memory device. According to some aspects, one or more blocks of FIG. 12 may be executed by one or more components of data storage controller 101 in connection with soft information module 103. Data storage controller 101 is configured to perform read operations to read data stored in a page of memory cells of one or more flash devices 104. For the purpose of this disclosure a "page" of memory cells may refer to a page, block, sector, codeword, or other unit of data read from flash memory. Additionally or in the alternative, a non-transitory machine-readable medium may include machine-executable instructions thereon that, when executed by a computer, machine, or processor, perform the blocks of FIG. 12.

In block 1201, a plurality of memory cells are read using a first read level to obtain a plurality of program values. In some aspects, the first read level may be determined based on whether the page of memory cells being read is a LSB or MSB page. For example, as illustrated by FIG. 5, a LSB read may be performed first to first determine whether the further reads will consider the L0/L1 boundary or the L2/L3 boundary of the affected cells. The first read level may be at one of these boundaries. Accordingly, in some implementations, an initial read level may be applied to the plurality of memory cells to obtain a least significant bit value for each of the plurality of memory cells, and then the first read level may be determined based on the least significant bit value.

In block 1202, an error indicator is received in connection with the reading of the plurality of memory cells. For example, the plurality of program values may be sent to a decoder, which cannot decode the program values because of errors. The program values are forwarded to ECC module 102 for error correcting, however, but the amount of errors may be too high for ECC module 102 to correct (e.g., above a predetermined threshold). In this case, data controller 101 or ECC module 102 may forward the program values to soft information module 103, together with the error indicator, to instruct soft information module 103 to generate reliability information for the program values for use in further decoding operations.

In block 1203, in response to receiving the error indicator, the plurality of memory cells are read at one or more different read levels to categorize the plurality of memory cells into two or more cell program regions. Accordingly, the first read level may be based on a predetermined threshold for distinguishing between two potential programming values of a memory cell (e.g., to determine the LSB). In this regard, a respective memory cell may be determined to be in a respective cell program region if the respective memory cell cannot be read at the first read level but is read at one of the different read levels associated with the respective cell program region.

The two or more cell program regions may be bounded by the first read level and one of the different read levels. For example, the plurality of memory cells may be read using a second read level below the first read level and a third read level above the first read level. In this regard, a first program region may include one or more cells having a programmed value between the first read level and the second read level and a second program region may include one or more cells having a programmed value between the first read level and the third read level. In another example, the plurality of memory cells may be read using a fourth read level below the second read level and a fifth read level above the sixth read level. In this regard, a third program region may include one or more cells having a programmed value between the fourth read level and the second read level and a fourth program region may include one or more cells having a programmed value between the fifth read level and the third read level.

In block 1204, a confidence value is assigned to each memory cell based on a corresponding cell program region for the memory cell, the confidence value being representative of a likelihood that the memory cell is programmed to a corresponding program value read at the first read level. For example, each confidence value may be a LLR value. In some aspects, a confidence value may be calculated, for each of the cell program regions, based on how many of the plurality of memory cells are in the cell program region compared to one or more other program regions. The confidence value calculated for a cell program region is assigned to each cell in the cell program region.

The plurality of program values may establish one or more cell program distributions. For example, some cells will be programmed to the L0 program level (FIG. 7A), some will be programmed to the L1 program level, and so on. With reference to FIG. 6 and formula (1), a lower confidence value is assigned to a cell program region comprising program values at an edge of a distribution than a cell program region comprising program values closer to a mean of the distribution. In some implementations, the confidence value assigned to each memory cell may be retrieved from a lookup table by indexing the lookup table by the corresponding cell program region.

Figure 13:
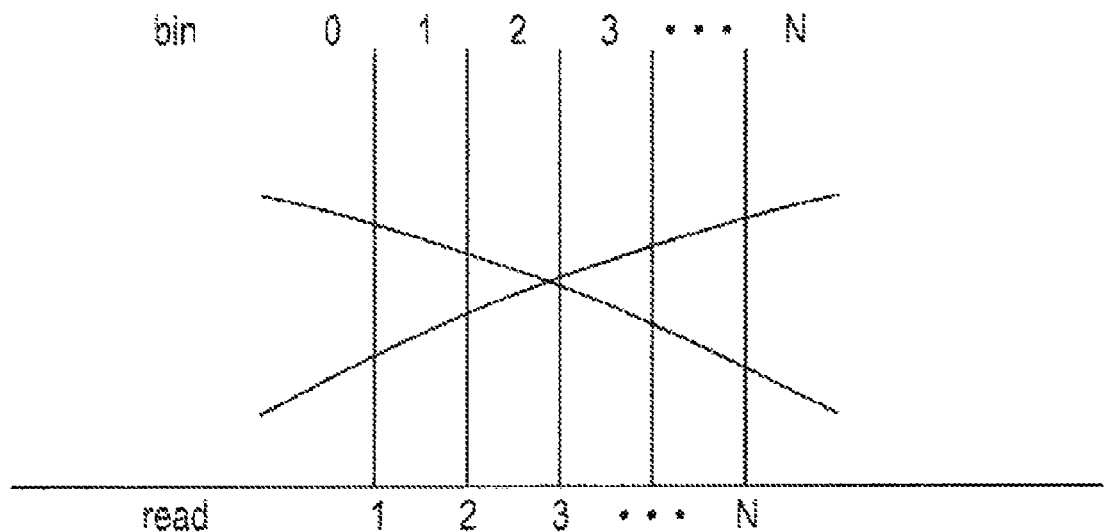
FIG. 13 illustrates example notations for read levels and cell program regions.
Figure 14A:
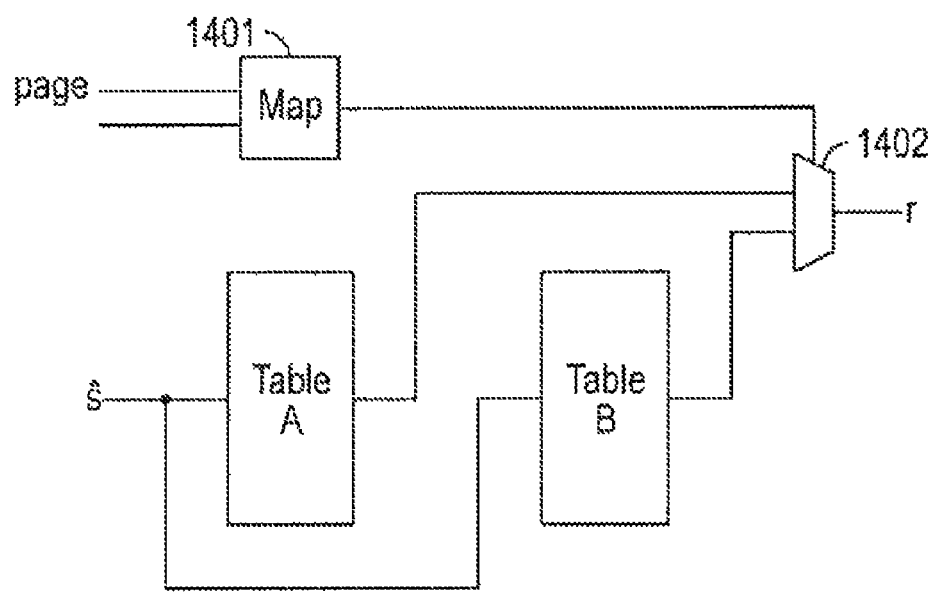
FIG. 14A depicts example components of a region discriminator, including a functional diagram for implementing a table selection process.

FIG. 13 illustrates example notations for read levels and cell program regions, according to aspects of the subject technology. In this example, the numbers advance from left to right. FIG. 14A depicts example components of a region discriminator, including a functional diagram for implementing a table selection process. In this example, the region discriminator includes a table selection map 1401 (FIG. 16B), a first table A, second table B, and a multiplexer 1402. As binary value ŝ are read from the memory cells, one or two lookup tables is used to determine which region each value belongs. In this regard, the region discriminator receives a page bit representative of whether the page being read is a MSB bit page, and a LSB bit for a corresponding MSB page.

FIG. 14B depicts an example table selection map for the region discriminator. Table selection map 1401 determines which table should be selected by multiplexer 1402. The use of either table is determined by what read level or region is currently active. For example, Table A is used to determine cell program regions for cells that contain no MSB data (e.g., a LSB page) and for cells that include MSB data in which the LSB bit is equal to 1. Table B is used to determine cell program regions for cells that include MSB data in which the LSB bit is equal to 0.

In some implementations, a default mapping from binary read values to region numbers is given by Table 2 and Table 3:

TABLE 2

RL₁, RL₂ and RL_{Low} regions (Table A of FIG. 16B)

| rd1 | rd2 | rd3 | bin |
|---|---|---|---|
| 0 | 0 | 0 | 3 |
| 0 | 0 | 1 | 2 |
| 0 | 1 | 0 | 1 |
| 0 | 1 | 1 | 1 |
| 1 | 0 | 0 | 0 |
| 1 | 0 | 1 | 0 |
| 1 | 1 | 0 | 0 |
| 1 | 1 | 1 | 0 |

TABLE 3

RL₃ region (Table B of FIG. 16B)

| rd1 | rd2 | rd3 | bin |
|---|---|---|---|
| 0 | 0 | 0 | 0 |
| 0 | 0 | 1 | 0 |
| 0 | 1 | 0 | 0 |
| 0 | 1 | 1 | 0 |
| 1 | 0 | 0 | 1 |
| 1 | 0 | 1 | 1 |
| 1 | 1 | 0 | 2 |
| 1 | 1 | 1 | 3 |

In one example, histogram generator 1103 may be used for calibration when 7 read scenarios need to be supported. The calibration may require 3 total memory banks, for example, 2 memory banks for the known data scenario, and 1 memory bank for the unknown data scenario. Each memory bank may have 8 columns corresponding to the 8 bins. In this example an MSB page may have two rows, as shown in Table 4:

TABLE 4

|  | 0 | 1 | 2 | 3 | 4 | 5 | 6 | 7 |
|---|---|---|---|---|---|---|---|---|
| RL1 |  |  |  |  |  |  |  |  |
| RL3 |  |  |  |  |  |  |  |  |

Furthermore, the LSB page may only require one row, as shown in Table 5:

TABLE 5

|  | 0 | 1 | 2 | 3 | 4 | 5 | 6 | 7 |
|---|---|---|---|---|---|---|---|---|
| RL2 |  |  |  |  |  |  |  |  |

FIG. 15 depicts a first example hardware schematic for determining how many memory cells are in each cell program region, according to aspects of the subject technology. Histogram generator 1103 may include two binary adders 1501 and 1502. Each adder counts the number of times a cell program region is indicated from a read operation (e.g., when reading a page of data). Binary adders 1501 and 1502 receive a cell program region number 1503 ($r_i$), a LSB bit indicator 1504 that indicates whether the region corresponds to a LSB or MSB, and a data enable 1505. Data enable 1505 is inverted for binary adder 1502 so that only one adder is selected at any one time depending on the bit value at data enable 1505. In the depicted example of FIG. 15, data enable 1505 receives a bit value for each region based on a predetermined calibration value for the region. As will be described with regard to FIG. 17, each binary adder includes a bank of values for each region, with binary adder 1501 tallying, for each region, the number of times the value for the region is 0 and the number of times the value for the region is 1.

FIG. 16 depicts a second example hardware schematic for determining how many memory cells are in each cell program region, according to aspects of the subject technology. In this example, no calibration data is received. Instead, binary adder 1501 tallies, for each region, the number of times the value for the region is 0 and the number of times the value for the region is 1, without any prior expectation or indication of what the value for the region should have been.

Figure 17:
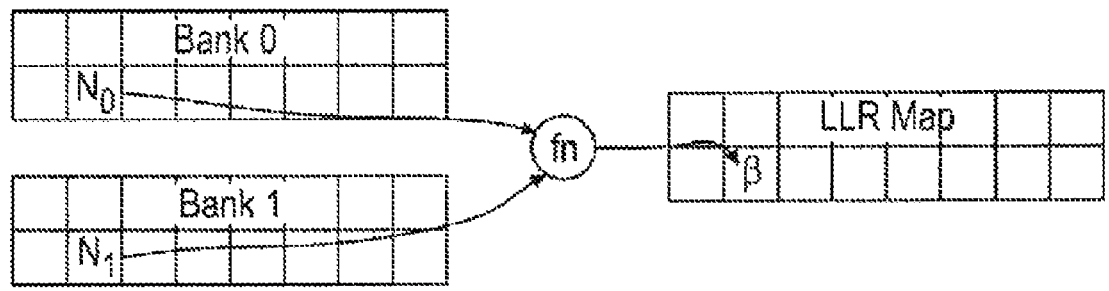
FIG. 17 depicts an example function map used for determining LLR values for each cell program region.

FIG. 17 depicts an example function map used for determining LLR values for each cell program region, according to some aspects of the subject disclosure. As illustrated, each location in the LLR map may be calculated from corresponding locations in the memory banks of the histogram generator 1103. In one example, the expression for calculating a map table in the case of known data is given by:

$$LLR = \log N_0 - \log N_1 \quad (7)$$

The expression for calculating a map table in the case of unknown data is given by:

$$LLR = \log N - \log N_{min} \quad (8)$$

In some implementations, the adders of FIGS. 15 and 16 may be 16 bits wide and may saturate upon reaching a maximum value. Once a sufficient number of counts have accumulated, the contents of the map table may be calculated using the accumulated values.

Figure 18:
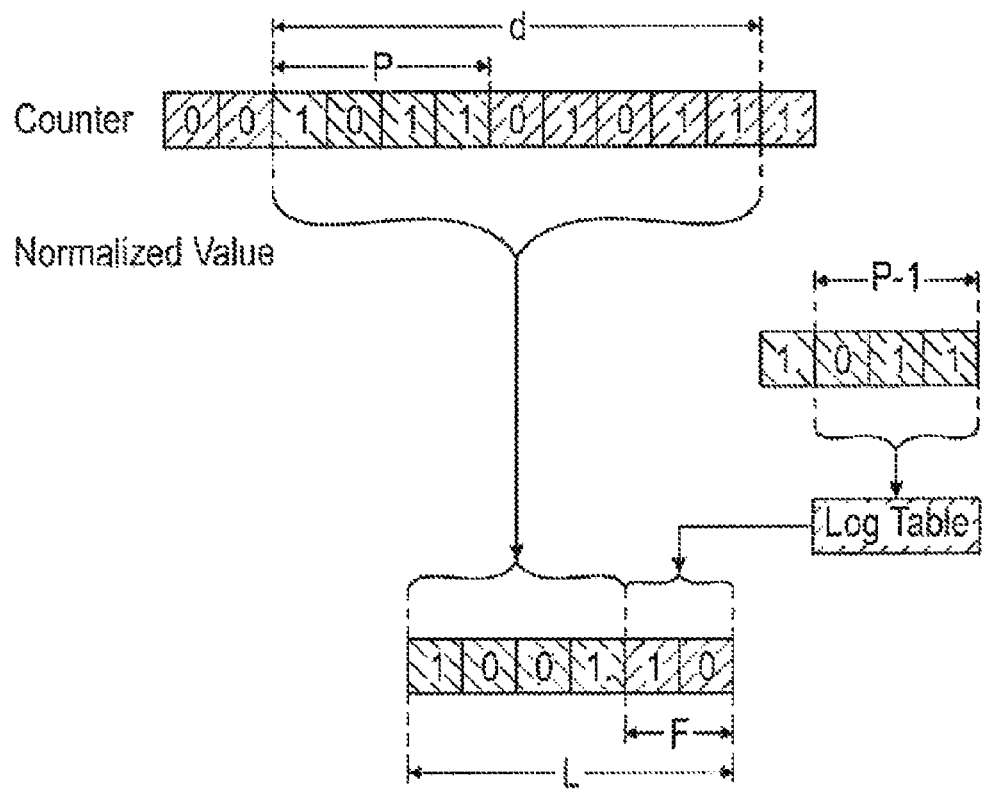
FIG. 18 depicts a first example hardware-implemented algorithm for calculating LLR values.

FIG. 18 depicts a first example hardware-implemented algorithm for calculating LLR values, according to aspects of the subject technology. The example algorithm illustrated by FIG. 18 corresponds to a base two algorithm, which may yield results proportional to the natural logarithm.

In practice, a first operation comprises taking the P most significant bits from the counter. Subsequently, the P most significant bits are normalized by shifting the most significant non-zero bit, by a shift amount (designated by 'd'), down to the LSB position. The P−1 remaining bits may be used as an index in the log table, wherein the output of the log table is the fractional part of the logarithm value. This fractional value is designated as 'F.' The integer part of the logarithm value is the shift required for normalization, d. The total width of the logarithm is given by 'L.' In some examples, L is less than the I/O precision of the LDPC decoder; thus, the precision of the LLR value (which requires a subtraction), is equal to the I/O precision of the LDPC decoder.

Figure 19:
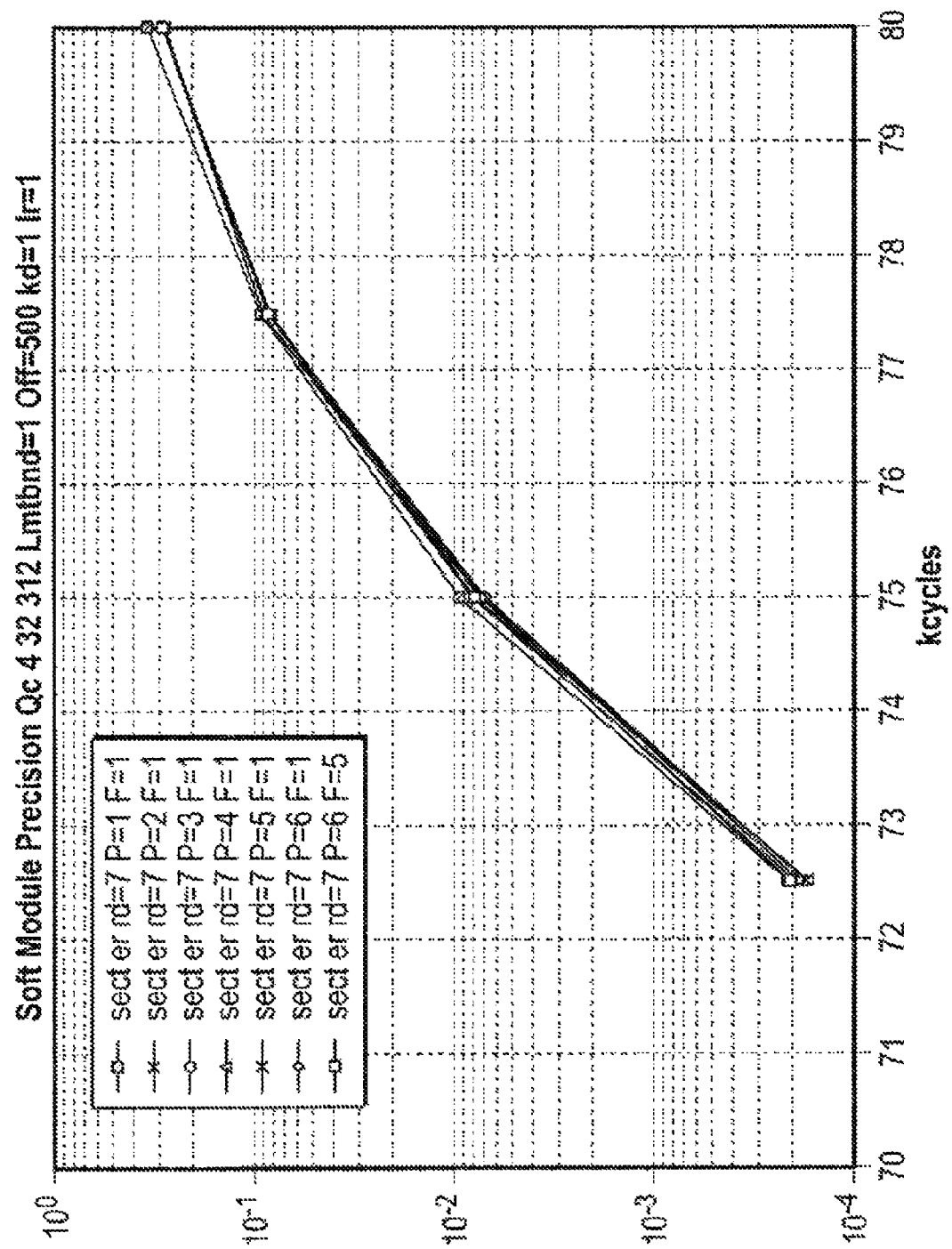
FIG. 19 depicts example simulation results for a soft information model.

FIG. 19 depicts example simulation results for a soft information model (e.g., for various precisions), according to one aspect of the subject technology. The simulation results of FIG. 19 were obtained for 7 different reads, using known data and a LSB read. The collected data is compared against the P=6 and F=5 case. As illustrated by FIG. 19, no discernable difference may exist down to P=2 and F=1.

Figure 20:
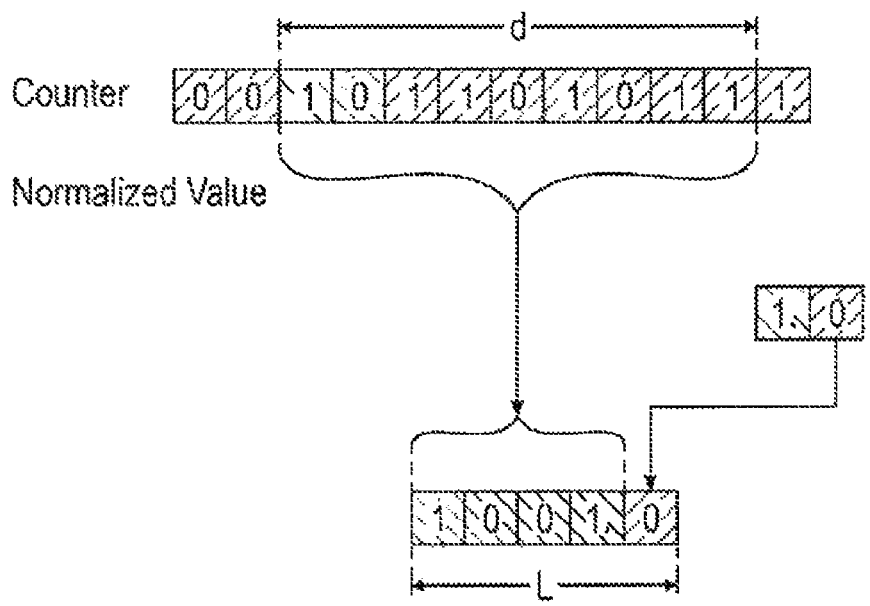
FIG. 20 depicts a second example hardware-implemented algorithm for calculating LLR values.

In some implementations, the selected values for the internal precision are P=2 and F=1. Using these values, the log table corresponds with an identity operation. Accordingly, FIG. 20 depicts a second example hardware-implemented algorithm for calculating LLR values, based on these selected values.

Figure 21A:
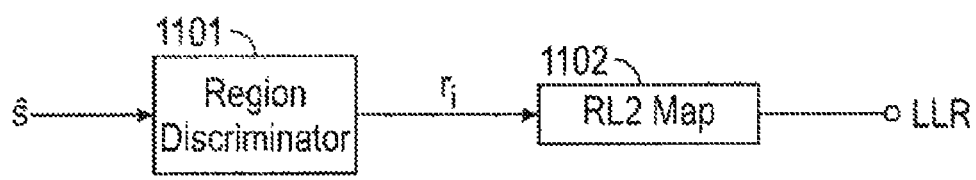
FIG. 21A depicts a LLR mapping operation for a LSB page.

FIG. 21A depicts a LLR mapping operation for a LSB page, according to some aspects of the technology. In the depicted example, region discriminator 1101 provides a cell program region number $r_i$ to LLR mapper 1102 based on cell data ŝ. In the depicted example, LLR mapper 1102 is a lookup table that converts a region number to a LLR value. With reference to FIG. 19, the region number $r_i$ may be used as an index to indicate which column in the LLR table should be selected. LLR mapper 1102 then produces the indexed LLR value.

The example of FIG. 21A is illustrative of determining LLRs for a memory cell with two possible outcomes (e.g., an LSB case). In a LSB case, the only row in the table that is used is the one for $RL_2$ or $RL_{LOW}$. The region number is an index that determines which element in the row to select in return.

Figure 21B:
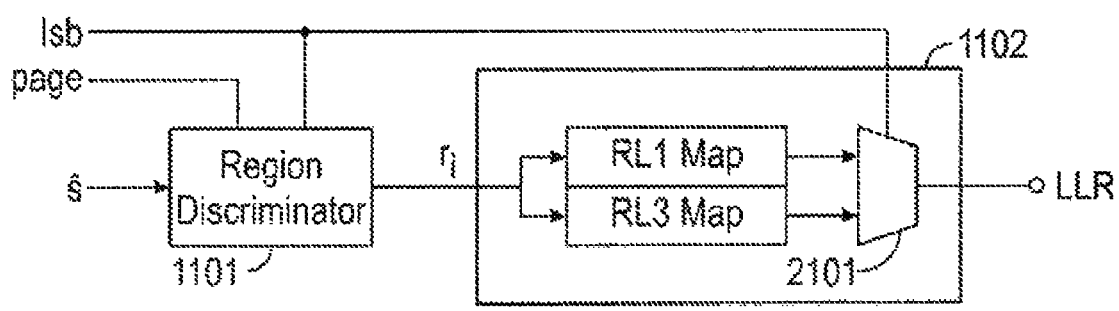
FIG. 21B depicts a LLR mapping operation for a MSB page.

FIG. 21B depicts a LLR mapping operation for a MSB page, according to aspects of the subject technology. In a mapping operation for a MSB page, a LLR table according to FIG. 19 may be organized into two rows—for RL1 and RL3. Accordingly, the region number is used to select the column of the table, and the LSB bit is used to (e.g., subsequently) select a particular row using a multiplexer 2101.

In some aspects, error signals may be based on an average LLR and/or an average sign value produced by LLR mapper 1102 satisfying a predetermined threshold. The determination of the average LLR and/or average sign value will be described further with respect to FIGS. 23 and 24. In some aspects, the error may result from a shift in the $V_T$ distributions occurring during the reading process relative to the $V_T$ distributions observed during calibration.

If it is assumed that $B_k$ represents an event where a cell falls into region k and further assumed that $\beta_k$ is the LLR value assigned to that region and that $p_k = \Pr(B_k)$ (representing the probability of the occurrence of event $B_k$), then the average LLR is may be calculated by:

$$\bar{\beta} = \sum_k \beta_k p_k \quad (9)$$

As such, the average is given by:

$$\bar{s} = \sum_k \mathrm{sgn}(\beta_k) p_k \quad (10)$$

Three values may be tracked based on the three read levels that are available.

Figure 22:
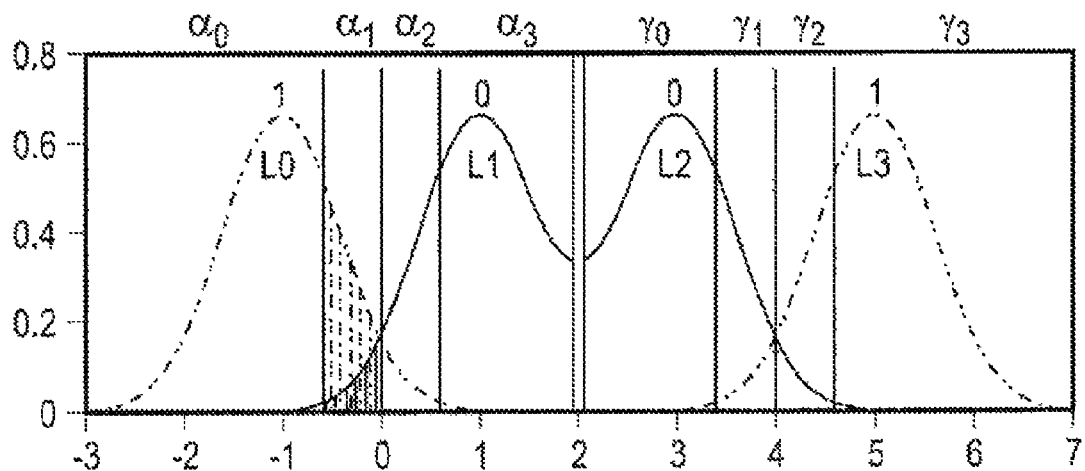
FIG. 22 depicts two example sets of regions associated with a MSB page using RL1 and RL3.

FIG. 22 depicts two example sets of regions associated with a MSB page using RL1 and RL3. In one example, the complete set of LLR values for the case of 3 reads is shown in

TABLE 6

| Region | LLR Values | | | |
|---|---|---|---|---|
| $RL_1$ | $\alpha_0$ | $\alpha_1$ | $\alpha_2$ | $\alpha_3$ |
| $RL_2$ | $\beta_0$ | $\beta_1$ | $\beta_2$ | $\beta_3$ |
| $RL_3$ | $\gamma_0$ | $\gamma_1$ | $\gamma_2$ | $\gamma_3$ |
| $RL_{LOW}$ | $\delta_0$ | $\delta_1$ | $\delta_2$ | $\delta_3$ |

In certain aspects, probabilities may be estimated by counting the number of cells that fall in each bin (LSB and MSB pages); for example, if $M_{jk}$ is the number of cells that fall in bin k of region j, an example of such estimates is given in Table 7:

TABLE 7

| Region | Cell Counts | | | |
|---|---|---|---|---|
| $RL_1$ | $M_{10}$ | $M_{11}$ | $M_{12}$ | $M_{13}$ |
| $RL_2$ | $M_{20}$ | $M_{21}$ | $M_{22}$ | $M_{23}$ |
| $RL_3$ | $M_{30}$ | $M_{31}$ | $M_{32}$ | $M_{33}$ |
| $RL_{LOW}$ | $M_{40}$ | $M_{41}$ | $M_{42}$ | $M_{43}$ |

The probabilities may be estimated using the following formula:

$$p_{jk} = \frac{M_{jk}}{\Sigma_{k'} M_{jk'}} \quad (11)$$

Probabilities for each bin and bin location are also given by:

TABLE 8

| Region | Probabilities | | | |
|---|---|---|---|---|
| $RL_1$ | $p_{10}$ | $p_{11}$ | $p_{12}$ | $p_{13}$ |
| $RL_2$ | $p_{20}$ | $p_{21}$ | $p_{22}$ | $p_{23}$ |
| $RL_3$ | $p_{30}$ | $p_{31}$ | $p_{32}$ | $p_{33}$ |
| $RL_{LOW}$ | $p_{40}$ | $p_{41}$ | $p_{42}$ | $p_{43}$ |

Using these estimates, the mean values may be calculated using the relationship:

$$\bar{\beta} = \frac{\Sigma_k \beta_k M_{2k}}{\Sigma_{k'} M_{2k'}} \quad (12)$$

Figure 23:
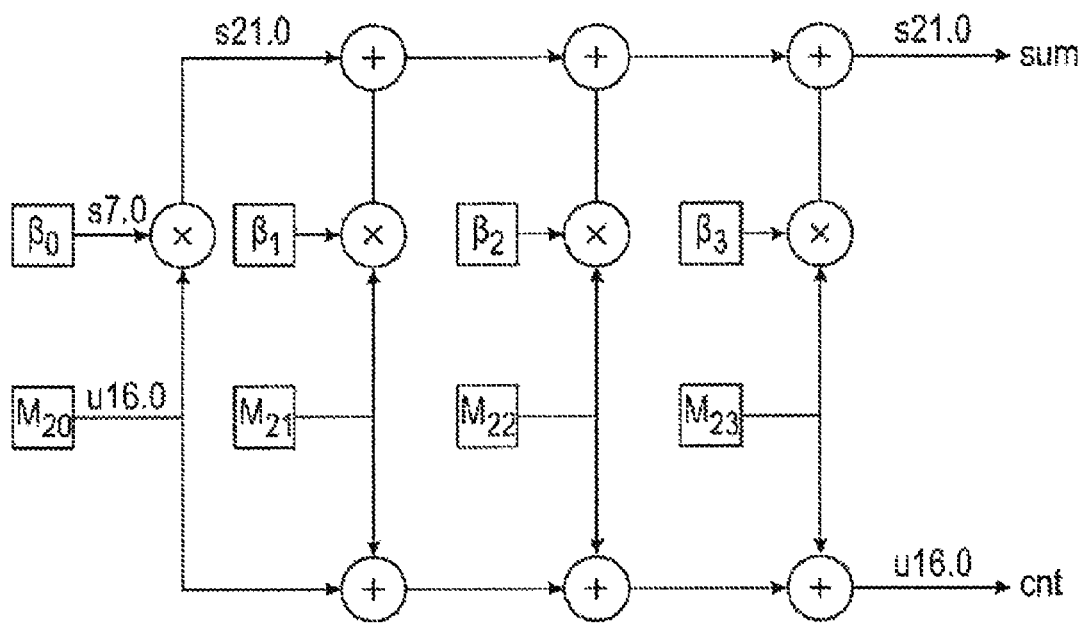
FIG. 23 depicts a block diagram of an example accumulator with quality metric inputs.

FIG. 23 depicts a block diagram of an example accumulator with quality metric inputs, according to aspects of the subject technology. In addition to determining LLR values, the subject technology may determine whether the currently used read levels are set to optimum values. It is expected that under optimal conditions the bit values received from the memory cells should be a near even split between 1's and 0's. Similarly, the sum of all LLR values for a read operation should be close to zero. Using the quality metrics described in Tables 6-8 (above) as inputs, accumulator generates a sum and count of the LLRs. In some implementations, the sum and count may be used for calculating the numerator and denominator of a mean estimate, or for determining an average LLR value.

In some implementations, the counts needed for the calculation of formula 12 may be provided by histogram generator 1103 operating in the previously described "unknown data mode" (FIG. 18). In some implementations, calculating the numerator may include adding the LLR values as they are generated, (rather than counting the number of times they occur) and then multiply the counts by the values.

Figure 24:
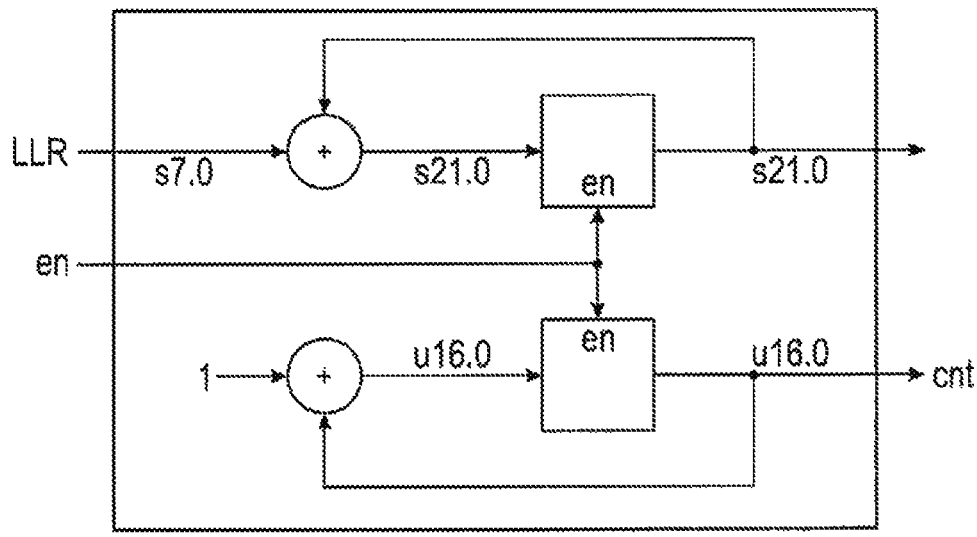
FIG. 24 depicts an example simplified accumulator for use during normal operations.

FIG. 24 depicts an example simplified accumulator for use during normal operations, according to aspects of the subject technology. Because of asymmetries in the distributions and in the range of allowed values for the read levels (even without an offset), the average values may not be zero. Thus an unbiased error signal may be defined as having a mean value at zero subtracted so that the resulting signal will be zero when the offset is equal to zero.

Figure 25A:
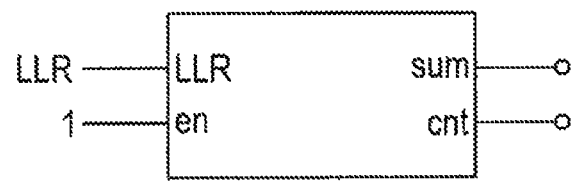
FIGS. 25A and 25B depict example hardware for supporting a LSB page decoding operation and a MSB page decoding operation, respectively.
Figure 25B:
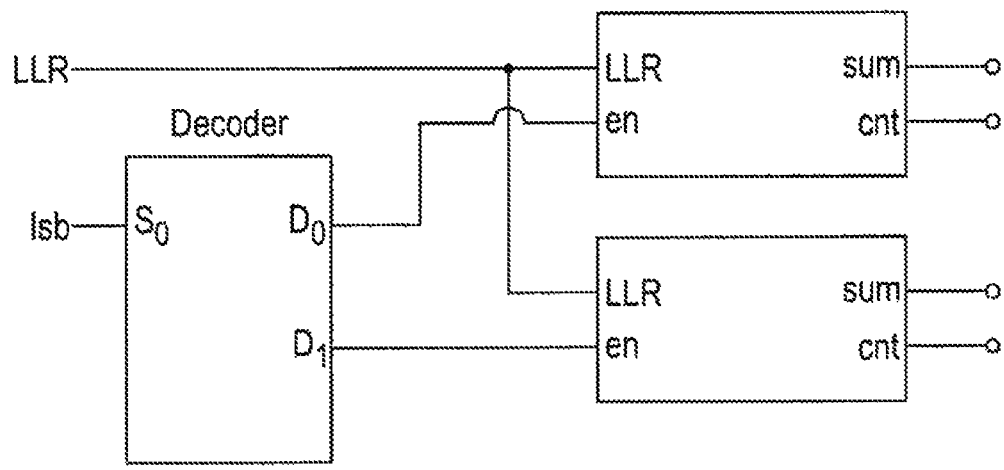

FIGS. 25A and 25B depict example hardware for supporting a LSB page decoding operation and a MSB page decoding operation, respectively, according to some aspects of the subject disclosure.

Figure 26A:
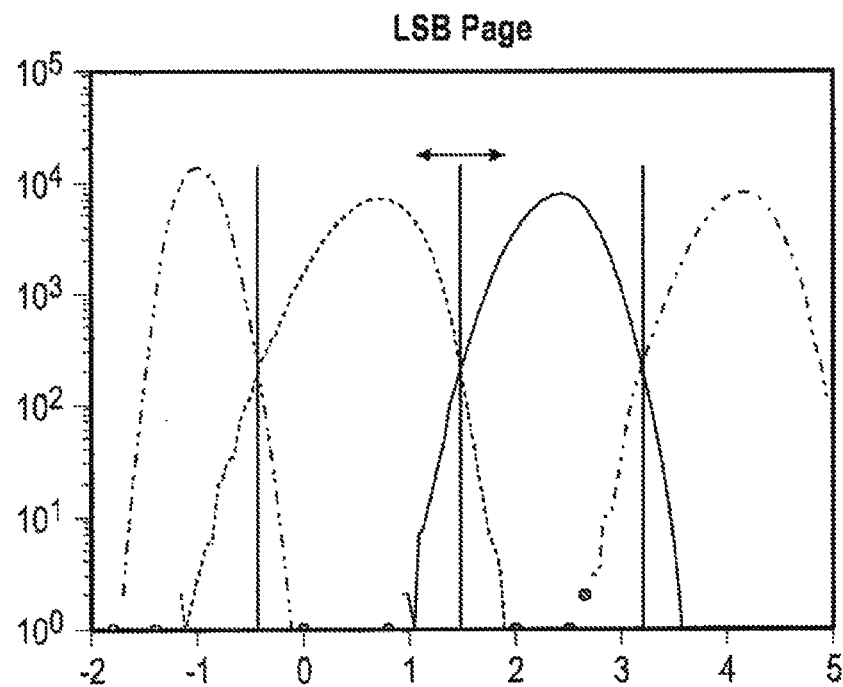
FIG. 26A depicts an example read level and direction of offset with respect to cell level distributions in a LSB page.
Figure 26B:
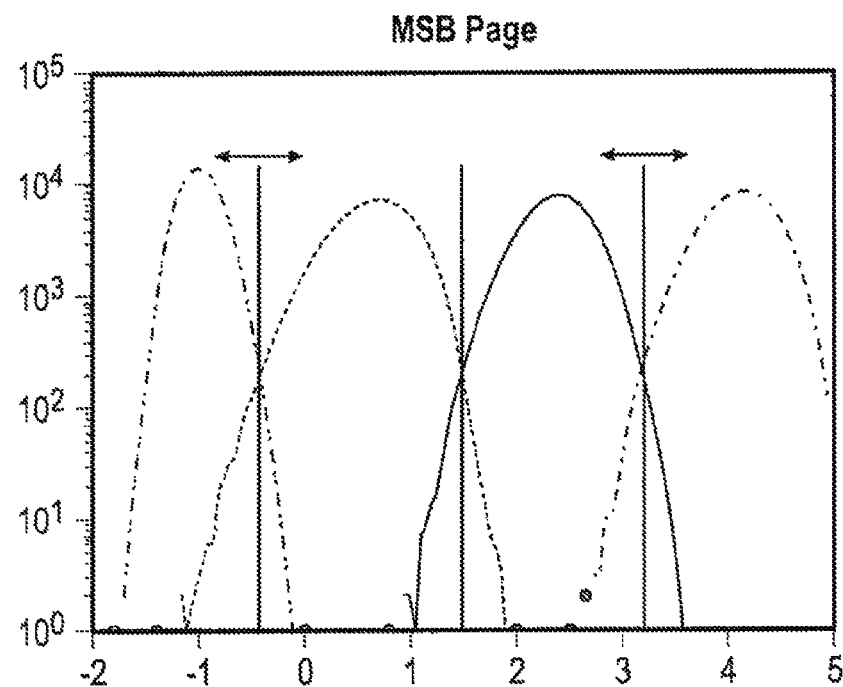
FIG. 26B depicts example read levels and corresponding direction of offset with respect to cell level distributions in a MSB page.

Error signals based on the average LLR and/or average sign value may be evaluated to determine whether a corresponding read level offset should be varied, and in some aspects, the amount of the variance. In order to isolate the effect of different read level offsets, it may be assumed that when reading a LSB page, that RL1 and RL3 have zero offset, while RL2 is shifted. Similarly, when reading a MSB page, it may be assumed that RL2 has zero offset, while RL1 and RL3 are shifted. FIG. 26A depicts an example read level and direction of offset with respect to cell level distributions in a LSB page. In the depicted example, the read level may be increased, moving the read level to the right of the drawing, or decreased, moving the read level to the left of the drawing. Similarly, FIG. 26B depicts example read levels and corresponding direction of offset with respect to cell level distributions in a MSB page.

In some hardware implementations, the soft information module may support a calibration mode and a LLR generation mode. Furthermore, the soft information module may use known data during calibration and may perform a LSB read for MSB pages during calibration and LLR generation. The calibration mode may be used as a heroic recovery technique for a specific sector that fails a soft decoding attempt. In some implementations, the hardware will support a software controlled update of the mapping table that is active at the time of the failure.

Figure 27:
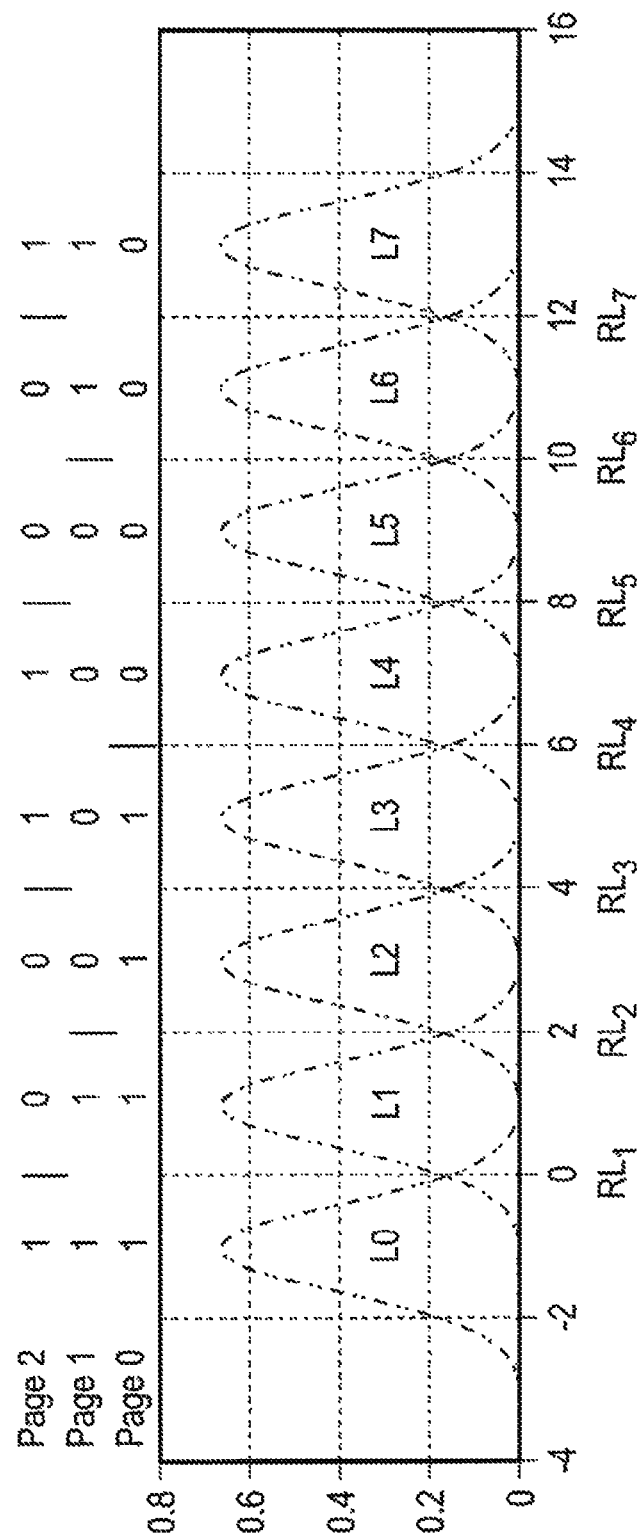
FIG. 27 illustrates TLC codes and gray code bit mapping for TLC flash memory.
Figures 28A, 28B:
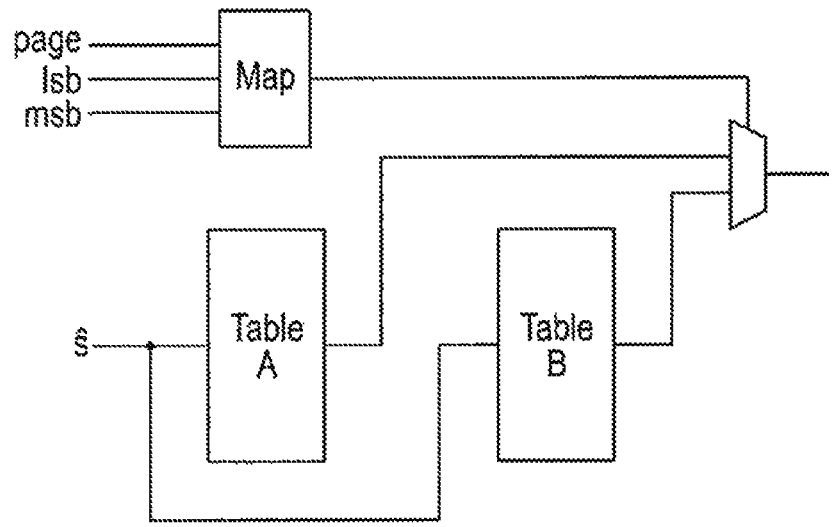
FIGS. 28A and 28B depict example components of a region discriminator and corresponding table selection map for read level to region mapping for TLC flash.

FIG. 27 illustrates TLC codes and gray code bit mapping for TLC flash memory, according to some aspects of the subject disclosure. In TLC flash memory, the read values for region mapping in the region discriminator may be the same as for MLC. However a designation of how TLC read levels are associated with the maps may be provided. For example, if RL1 and RL2 are associated with table A of FIG. 14, and RL3 with table B of FIG. 14, then the TLC read levels may be designated as follows: table A of FIG. 14 may be assigned to RL1, RL2, RL4 and RL5 and table B of FIG. 14 may be assigned to RL3, RL6 and RL7. Accordingly, FIGS. 28A and 28B depict example components of a region discriminator and corresponding table selection map for read level to region mapping for TLC flash.

In implementations that use TLC flash memory, there may not be any support for calibration or for partially programmed word lines. With these restrictions there is no need for a known data stream—the only concern is the 7 primary read levels.

Figure 29A:
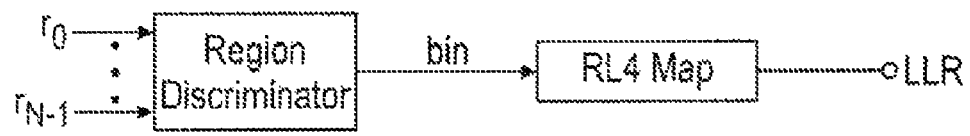
FIG. 29A depicts an example LLR mapping operation for page 0 of a TLC flash memory.

FIG. 29A depicts an example LLR mapping operation for page 0 of a TLC flash memory. In certain aspects, the table of LLR mapper 1102 for TLC will have 7 rows. As with MLC, the region number may be used as an index to indicate which column table to select. In some examples, page 0 may be the simplest case to handle because the only row in the table is the one for $RL_4$.

Figure 29B:
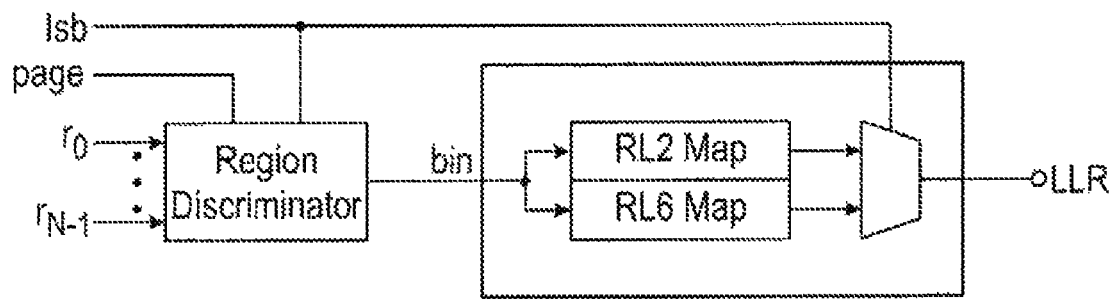
FIG. 29B depicts an example LLR mapping operation for page 1 of a TLC flash memory.

FIG. 29B depicts an example LLR mapping operation for page 1 of a TLC flash memory. As compared to the LLR mapping operation for page 0 (described above), the LLR mapping operation for page 1 may be more complicated. For example, a LLR mapping operation of page 1 requires rows RL2 and RL6. As previously described with respect to FIG. 21B and MLC flash, the region number may be first used to select the column of the table of LLR mapper 1102. Then, the page 0 bit may be used to select the row.

Figure 30:
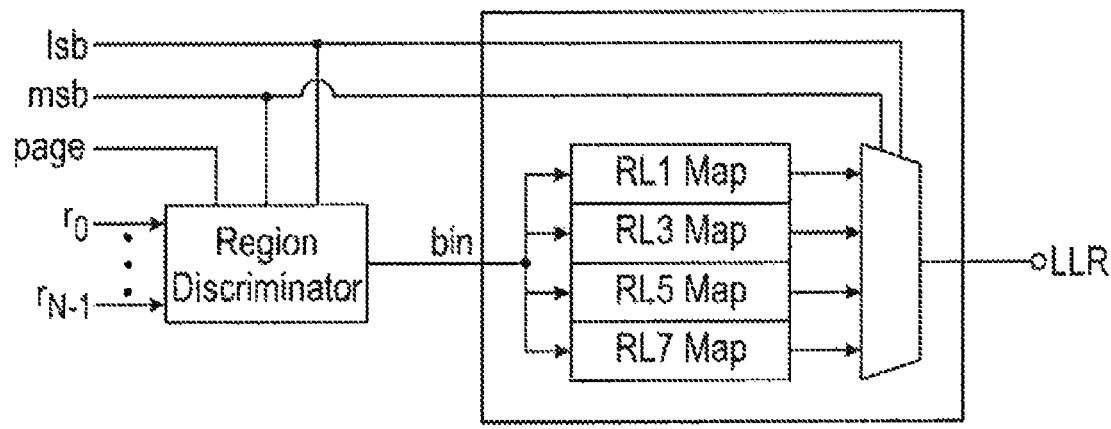
FIG. 30 depicts an example of a LLR mapping operation for page 2 of a TLC flash.

FIG. 30 depicts an example of a LLR mapping operation for page 2 of a TLC flash. In some implementations, the mapping operation for page 2 may be more complicated than that for page 1. For this case it must be taken into account that rows RL1, RL3, RL5 and RL7 are required. The region number may be used to first select the column of the table, and then the page 0 and page 1 bits are used to select a row.

Figure 31:
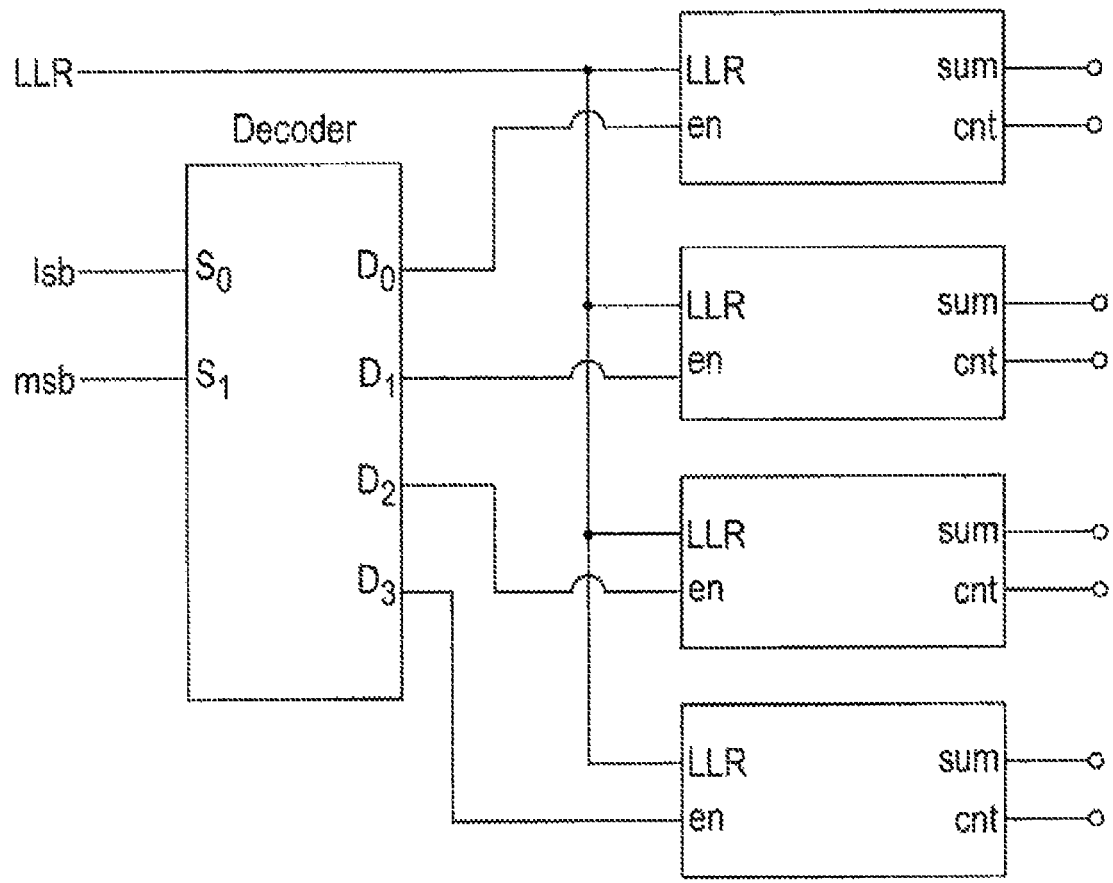
FIG. 31 depicts example hardware for implementing an accumulator, including calculating a quality metric for page 0 of TLC flash memory.

A quality metric for page 0 may be calculated using the structure shown in FIG. 23, above. Similarly, a quality metric for page 1 may be calculated using the structure shown in FIG. 24, above. In this regard, FIG. 31 depicts example hardware for implementing an accumulator, including calculating a quality metric for page 0 of TLC flash memory, according to some aspects of the subject disclosure.

Figure 32:
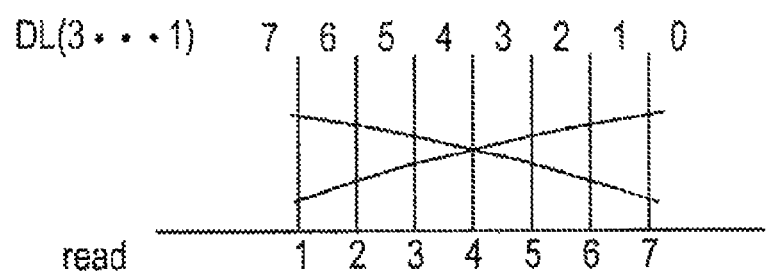
FIG. 32 illustrates example notations for a read index and a region number for a flash device.

FIG. 32 illustrates example notations for a read index and a region number for a flash device, according to certain aspects of the subject technology. Table 9 example region mappings for the read indices indicated in FIG. 32.

TABLE 9

|  | Vt1 | Vt2 | Vt3 | Vt4 | Vt5 | Vt6 | Vt7 | Vt8 |
| --- | --- | --- | --- | --- | --- | --- | --- | --- |
| DL1 | 1 | 1 | 1 | 1 | 0 | 0 | 0 | 0 |
| DL2 | 1 | 1 | 0 | 0 | 1 | 1 | 0 | 0 |
| DL3 | 1 | 0 | 1 | 0 | 1 | 0 | 1 | 0 |

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is presented as an illustration of some exemplary approaches. Based upon design preferences and/or other considerations, it is understood that the specific order or hierarchy of steps in the processes may be rearranged. For example, in some implementations some of the steps may be performed simultaneously. Thus the accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code may be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

What is claimed is:

1. A method, comprising:
   receiving an initial value read from a memory cell at an initial read level, and a plurality of secondary values read from the memory cell at a plurality of respective different read levels offset from the initial read level;
   receiving a page indicator indicating a page for which the read of the memory cell was performed;
   determining a cell program region for the memory cell based on the initial value, the plurality of secondary values, and the page indicator;
   identifying a predetermined confidence value associated with the cell program region; and
   associating the identified confidence value with the initial value, the confidence value being representative of a likelihood that the memory cell was programmed to the initial value.

2. The method of claim 1, wherein determining the cell program region comprises:
   determining a region lookup table from a plurality of lookup tables based on the page indicator for the read; and
   determining the cell program region for the memory cell based on the determined lookup table, the initial value and the plurality of secondary values.

3. The method of claim 1, further comprising:
   determining a count of memory cells in the cell program region;
   providing a bit series corresponding to the count;
   shifting at least a portion of the bit series by a predetermined shift amount;
   determining a first portion of the confidence value based on indexing a confidence table by at least a portion of the shifted portion of bit series; and
   determining a second portion of the confidence value based on the predetermined shift amount.

4. The method of claim 3, further comprising:
   determining, based on the determined count, a respective area of a distribution curve corresponding to the cell program region; and
   determining the confidence value based on a size of the respective area as compared to sizes of other areas of the distribution curve corresponding to other cell program regions.

5. The method of claim 1, wherein the read of the memory cell comprises a read of a page of memory cells, wherein the page indicator is representative of whether the page of memory cells being read is a LSB (least significant bit) page or a MSB (most significant bit) page.

6. The method of claim 1, wherein the cell program region is bounded by the initial read level and one of the different read levels.

7. The method of claim 1, wherein the plurality of respective different read levels offset from the initial read level comprise a first read level below the initial read level and a second read level above the initial read level,
   wherein the determined cell program region is defined for values between the first read level and the initial read level or the initial read level and the second read level.

8. The method of claim 1, wherein the initial read level is based on a predetermined threshold for distinguishing between two potential bit values of a memory cell.

9. The method of claim 1, wherein the confidence value is a log-likelihood ratio.

10. The method of claim 1, wherein a plurality of memory cells, including the memory cell, are read at the plurality of different read levels in response to a read error being received based on the read of the memory cell at the initial read level.

11. The method of claim 1, further comprising:
    reading a plurality of memory cells, including the memory cell, to obtain a least significant bit value for the plurality of memory cells; and
    determining the initial read level based on the least significant bit value.

12. A system, comprising:
    one or more flash memory devices;
    a decoder; and
    a soft information module coupled between the one or more flash memory devices and the decoder, the soft information module operable to:
    receive an initial value read from a memory cell at an initial read level, and a plurality of secondary values read from the memory cell at a plurality of respective different read levels offset from the initial read level;
    receive a page indicator indicating a page for which the read of the flash memory cell was performed;
    determine a cell program region for the memory cell based on the initial value, the plurality of secondary values, and the page indicator;
    identify a predetermined confidence value associated with the cell program region; and
    provide the identified confidence value to the decoder for association with the initial value, the confidence value being representative of a likelihood that the memory cell was programmed to the initial value.

13. The system of claim 12, wherein determining the cell program region comprises:
    determining a region lookup table from a plurality of lookup tables based on the page indicator for the read; and
    determining the cell program region for the memory cell based on the determined lookup table, the initial value, and the plurality of secondary values.

14. The system of claim 12, wherein the soft information module is further opera to:
    determine a count of memory cells in the cell program region;
    providing a bit series corresponding to the count;
    shift at least a portion of the bit series by a predetermined shift amount;
    determine a first portion of the confidence value based on indexing a confidence table by at least a portion of the shifted portion of bit series; and
    determine a second portion of the confidence value based on the predetermined shift amount.

15. The system of claim 14, wherein the soft information module is further operable to:
    determining, based on the determined count, a respective area of a distribution curve corresponding to the cell program region; and
    determining the confidence value based on a size of the respective area as compared to sizes of other areas of the distribution curve corresponding to other cell program regions.

16. The system of claim 12, wherein the read of the memory cell comprises a read of a page of memory cells; wherein the page indicator is representative of whether the page of memory cells being read is a LSB (least significant bit) page or a MSB (most significant bit) page.

17. The system of claim 12; wherein the cell program region is bounded by the initial read level and one of the different read levels.

18. The system of claim 12, wherein the different read levels offset from the initial read level comprise a first read level below the initial read level and a second read level above the initial read level,
    wherein the determined cell program region is defined for values between the first read level and the initial read level or the initial read level and the second read level.

19. The system of claim 12, wherein the confidence value is a log-likelihood ratio.

20. The system of claim 12, wherein a plurality of memory cells, including the memory cell, are read at the different read levels in response to a read error being received based on the read of the memory cell at the initial read level.

* * * * *